(12) United States Patent
Gardner et al.

(10) Patent No.: US 11,557,519 B2
(45) Date of Patent: Jan. 17, 2023

(54) OPTIMUM HIGH DENSITY 3D DEVICE LAYOUT AND METHOD OF FABRICATION

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 33 days.

(21) Appl. No.: 17/108,525

(22) Filed: Dec. 1, 2020

(65) Prior Publication Data

US 2022/0059413 A1    Feb. 24, 2022

Related U.S. Application Data

(60) Provisional application No. 63/068,801, filed on Aug. 21, 2020.

(51) Int. Cl.
*H01L 21/8238* (2006.01)
*H01L 29/66* (2006.01)
*H01L 29/78* (2006.01)

(52) U.S. Cl.
CPC ......... *H01L 21/823885* (2013.01); *H01L 29/66666* (2013.01); *H01L 29/7827* (2013.01)

(58) Field of Classification Search
None
See application file for complete search history.

(56) References Cited

U.S. PATENT DOCUMENTS 10,424,653 B1 * 9/2019 Zhang ............... H01L 29/78681
2013/0341702 A1 * 12/2013 Kar ....................... H01L 29/792
257/324

* cited by examiner

*Primary Examiner* — Hsien Ming Lee
(74) *Attorney, Agent, or Firm* — Oblon, McClelland, Maier & Neustadt, L.L.P.

(57) ABSTRACT

Techniques herein include methods for fabricating complete field effect transistors having an upright or vertical orientation. The methods can utilize epitaxial growth to provide fine control over material deposition and thickness of said material layers. The methods can provide separate control of channel doping in either NMOS and/or PMOS transistors. All of a source, channel, and drain can be epitaxially grown in an opening into a dielectric layer stack, with said doping executed during said epitaxial growth.

19 Claims, 18 Drawing Sheets

OPTIMUM HIGH DENSITY 3D DEVICE LAYOUT AND METHOD OF FABRICATION

CROSS REFERENCE TO RELATED APPLICATIONS

This present disclosure claims the benefit of U.S. Provisional Application No. 63/068,801, filed on Aug. 21, 2020, which is incorporated herein by reference in its entirety.

FIELD OF THE INVENTION

The present disclosure relates to a method of fabrication for an upright transistor with separate control of channel doping via epitaxial growth to increase density of fabricated 3D devices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e. the vertical stacking of multiple devices, aims to overcome these scaling limitations by increasing transistor density in volume rather than area. Although device stacking has been successfully demonstrated and implemented by the flash memory industry with the adoption of 3D NAND, application to random logic designs is more difficult. Thus, 3D integration for logic chips (e.g. CPU (central processing unit), GPU (graphics processing unit), FPGA (field programmable gate array), and SoC (system on a chip)) is desired.

SUMMARY

The present disclosure relates to a method of fabricating a semiconductor device, including: forming a multilayer stack on a surface of a substrate, the multilayer stack including a first dielectric material in a first layer, a second dielectric material in a second layer, and a third dielectric material in a third layer, any one of the first dielectric material, the second dielectric material, and the third dielectric material being selective to the other dielectric materials; forming at least one opening through the multilayer stack to the surface of the substrate; and growing a first transistor in a first opening of the at least one opening, the first transistor including a first source/drain region proximal to the substrate, a channel region disposed vertically overtop the first source/drain region, and a second source/drain region disposed vertically overtop the channel region on a side of the channel region distal to the substrate.

The present disclosure additionally relates to a semiconductor device, including: a first source/drain region disposed on a substrate; a channel region disposed vertically overtop the first source/drain region perpendicular relative to a plane of the substrate; a second source/drain region disposed vertically overtop the channel region; a metal silicide formed laterally along sidewalls of the first source/drain region and laterally along sidewalls of the second source/drain region; a high-K dielectric formed laterally adjacent to sidewalls of the channel region; a first source/drain contact formed laterally along the metal silicide formed on the first source/drain region; a second source/drain contact formed laterally along the metal silicide formed on the second source/drain region; and a gate contact formed on the high-K dielectric.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
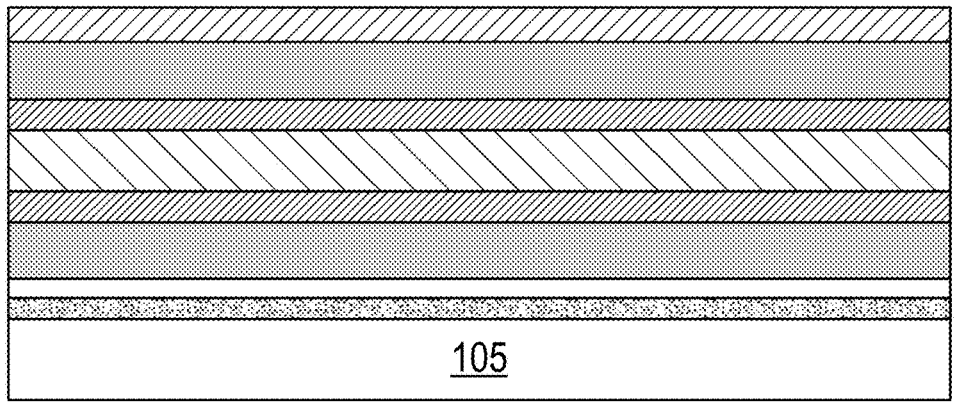
FIG. 1 is a cross-sectional substrate segment including deposited layers of different dielectric types, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein provide methods of microfabrication and device layout for increasing density of 3D devices via epitaxially growing a complete field effect transistor (FET)—NMOS and/or PMOS—having an upright or vertical orientation. Embodiments include epitaxially grown upright complete NMOS transistors and PMOS transistors with separate control of channel doping. All of a source, channel, and drain are epitaxially grown in an opening into a dielectric layer stack. Doping is executed during the epitaxial growth process. This reduces process steps and increases scaling capability. Other advantages include easier access of the gate-all-around (GAA) structure, including 360 degree symmetry for device connections, improved Idsat with optimum device layout, and maximum scaling for channel thickness or length which is controlled by epitaxy instead of photolithography. Techniques herein are also advantageous because an area of silicon is reduced because transistors are fabricated in 3D vertical dimension enhancing the density of the silicon circuit. Embodiments also include a robust process flow that is compatible with 3D memory, 3D Logic, and high-performance logic. Techniques herein can be used with any type of device used in 3D logic.

Embodiments herein are described with several process flows.

A first process flow describes NMOS GAA nano transistor upright grown epi (epitaxial) stacks complete with all junctions with substrate isolation.

Flow C (FIGS. 27-47) illustrates NMOS upright epi transistor adjacent to PMOS upright epi transistor for CMOS process flow.

FIG. 1 is a cross-sectional substrate segment including deposited layers of different dielectric types, according to an embodiment of the present disclosure. In an embodiment, a multilayer stack 100 (herein referred to as "stack 100") can include a substrate 105, a first dielectric 110 disposed overtop an oxide 195 on the substrate 105, a second dielectric 115 disposed overtop the first dielectric 110, a third dielectric 120 disposed overtop the second dielectric 115, and a hardmask 125 disposed overtop the third dielectric 120. Each dielectric 110, 115, 120 can be selective to each other. That is, any predetermined dielectric of the dielectrics 110, 115, 120 can be etched without substantially etching the remaining dielectric materials. For example, the first dielectric 110 can be chosen to have selectivity to a predetermined etchant while the second dielectric 115 and the third dielectric 120 are not selective to the predetermined etchant. It may be appreciated by those in the art that material etch selectivities are generally known. As shown in FIG. 1, in a non-limiting example, the substrate 105 can be silicon with the oxide 195 on top of the silicon substrate 105, followed by additional silicon on top of the oxide 195. Materials for the hardmask 125 can be organic or inorganic. Examples of organic materials for the hardmask 125 can include amorphous carbon or organo siloxane-based materials with reflection control properties, among others. The organic hardmasks 125 can be formed by chemical vapor deposition (CVD) or spin-on processes. Examples of inorganic materials for the hardmask 125 can include SiN, SiON or TiN, among others. The inorganic hardmasks 125 can be deposited through CVD process. In other embodiments, the oxide 195 can be any semiconductor stack, such as silicon/oxide/Ge or silicon/oxide/SiGe, among others. A top surface of the substrate 105 can be any type of semiconductor.

Figure 2:
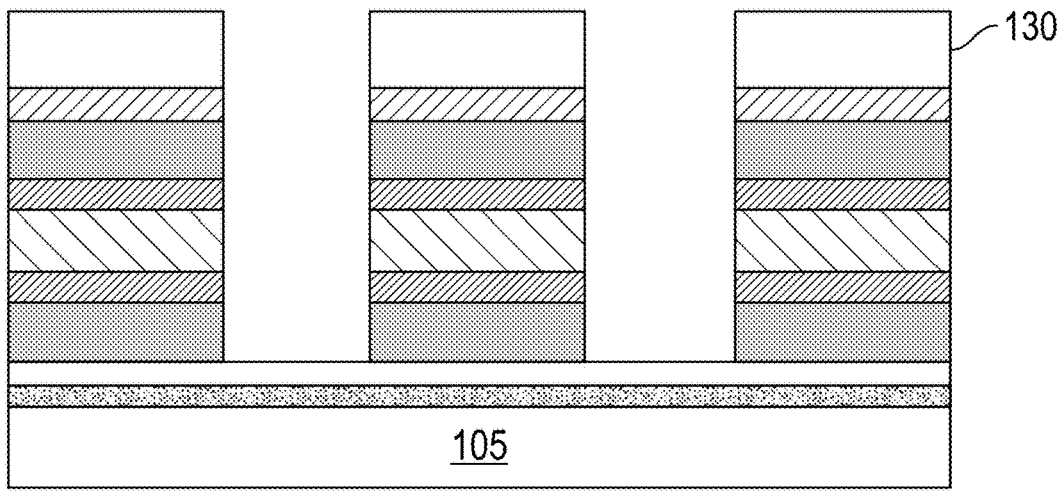
FIG. 2 is a cross-sectional substrate segment illustrating etching of the stack, according to an embodiment of the present disclosure.

FIG. 2 is a cross-sectional substrate segment illustrating etching of the stack 100, according to an embodiment of the present disclosure. In an embodiment, an etch mask 130 can be formed on the stack 100 and subsequently patterned using photolithography. The etch mask 130 can be used to create openings in the stack 100 via, for example, etching, for future vertical-flow transistor channels or upright nanostack devices to be grown epitaxially within. That is, the etching process can form recesses where the etch mask 130 is not protecting the material below. Thus, the stack 100 can be etched through the first dielectric 110, the second dielectric 115, and the third dielectric 120 layers until uncovering a layer of semiconductor material, such as silicon or Ge on the oxide 195. The etch mask 130 can be removed and the stack 100 can be cleaned.

Figure 3:
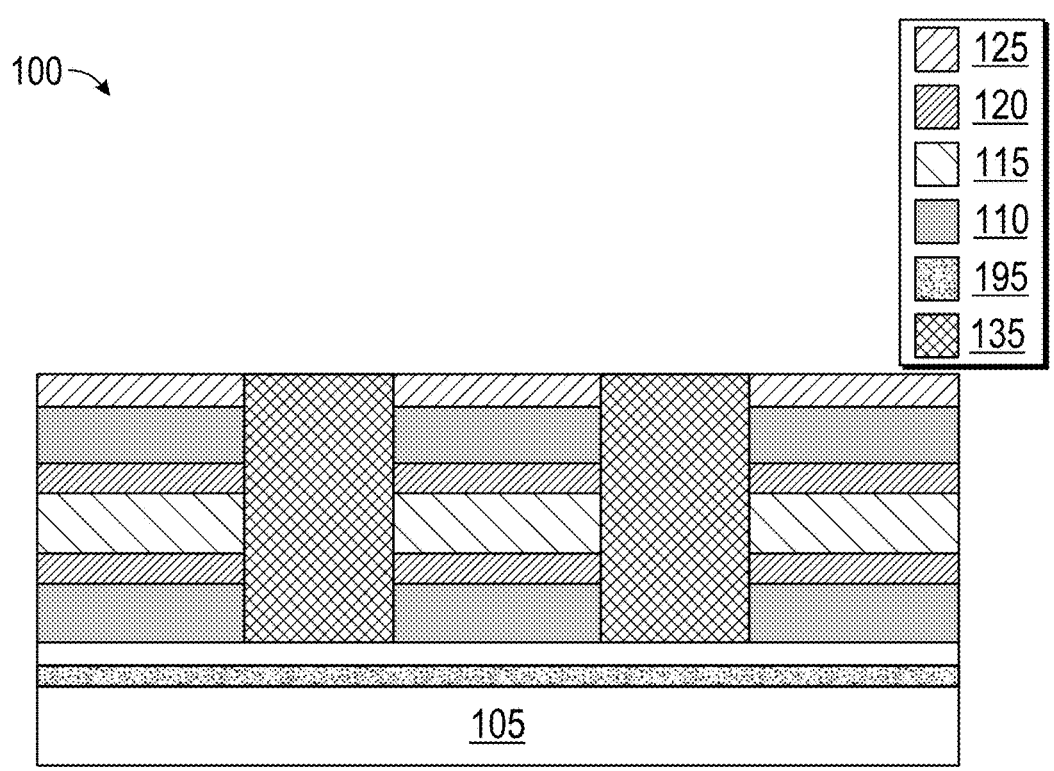
FIG. 3 is a cross-sectional substrate segment illustrating device formation, according to an embodiment of the present disclosure.

FIG. 3 is a cross-sectional substrate segment illustrating device formation, according to an embodiment of the present disclosure. In an embodiment, devices can be grown in the recesses defined by the etch. For example, an NMOS graded epitaxial device stack 135 (herein referred to as "NMOS transistor 135") can be grown in the openings. For example, N-doped epitaxial material acting as a first source/drain (S/D) can be grown. P-epi or intrinsic material can be grown for a channel region on the first S/D. Then, N-doped epitaxial material acting as a second S/D can be grown. Accordingly, a complete, doped NMOS transistor 135 can be formed in one in-situ epitaxial growth process. As shown, the NMOS transistor 135 is uniform, but via the method of fabrication disclosed herein, the NMOS transistor 135 can be fabricated with a gradation as material is deposited from one end to another. That is, there can be a first predetermined gradient as the first S/D transitions to the channel region, and there can be a second predetermined gradient as the channel region transitions to the second S/D. It may be appreciated that the NMOS transistor 135 need not be graded. The NMOS transistor 135 can be formed via an in-situ process, such as epitaxial growth. The in-situ epitaxial growth process can be completed in a single in-situ growth step or using a single epitaxial growth sequence. That is, further processing of the stack 100 layers may not be required between growing each component of the NMOS transistor 135. N-type dopants can be, for example, arsenic or phosphorous, among others. P-type dopants can be, for example, boron or indium, among others. More generally, a vertically-grown, epitaxial structure can be formed.

Figure 4:
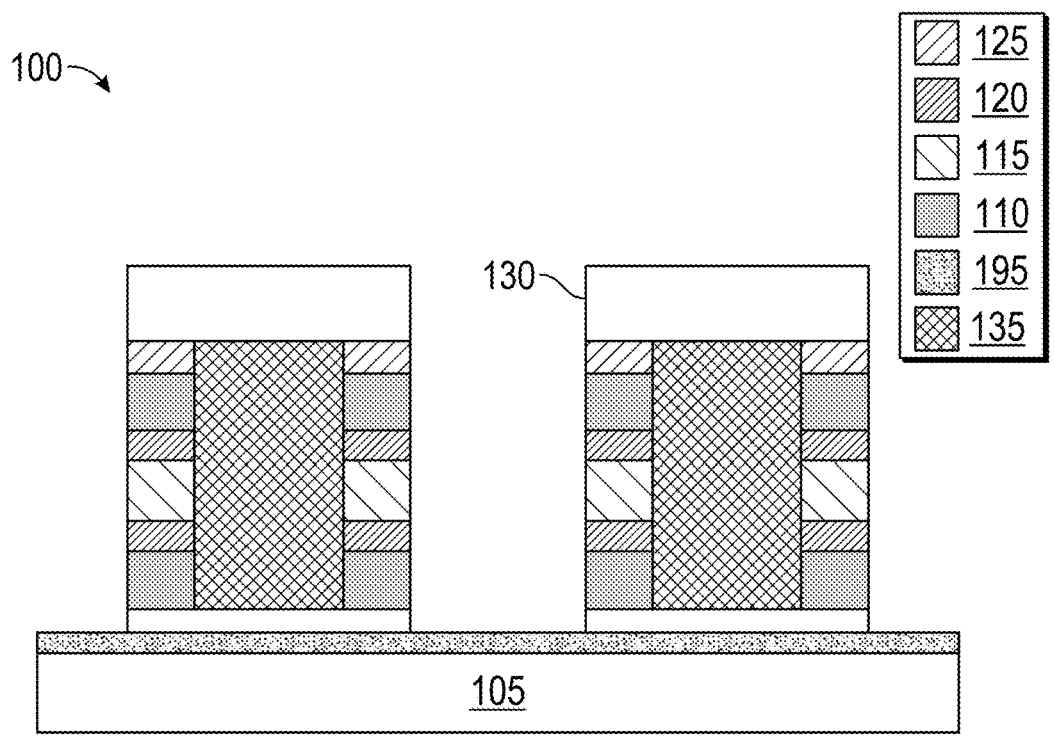
FIG. 4 is a cross-sectional substrate segment illustrating device definition, according to an embodiment of the present disclosure.

FIG. 4 is a cross-sectional substrate segment illustrating device definition, according to an embodiment of the present disclosure. In an embodiment, the etch mask 130 can be formed and patterned again to cover the newly grown NMOS transistor 135. Notably, the etch mask 130 can extend a distance exceeding the lateral width of the NMOS transistor 135 to form an overhang. The etch mask 130 can be formed to etch dielectric material on the substrate 105 while leaving a thickness of the dielectric stack around (or on sides of) the upright NMOS transistor 135. Upright herein can mean perpendicular to a working surface of the substrate 105. A directional (anisotropic) etch can be executed to remove uncovered portions of the stack 100 such that a portion of an adjacent layer stack of the dielectrics 110, 115, 120 remains on either side (or all sides) of the upright NMOS transistor 135. The etch mask 130 can be removed to reveal the NMOS transistor 135 including the portion of the adjacent layer stack of the dielectrics 110, 115, 120.

It may be appreciated by those in the art that the single-step in-situ epitaxial growth or single epitaxial growth sequence can enable faster processing by eliminating vacuum pump down steps and the growth may only require changing of chemical precursors while the fabrication environment is already under low vacuum. Furthermore, the epitaxial growth process can enable fine control over the amount of growth of the layers. That is, a thickness (in the vertical or upright direction, as shown) of the layers of the dielectric materials 110, 115, 120 as well as the NMOS transistor 135 can be finely tuned. For example, as shown, a thickness of the channel region can be epitaxially grown to match a thickness of the second dielectric 115 layer, as well as a height of the channel region matching a height of the second dielectric 115 layer. This can be enabled by fine control over the growth of the underlying layers for both the channel region and the second dielectric 115 layer. In doing so, a thickness of the eventual gate contact will be a same thickness as the channel region (as well as the deposited high-K material 145, described below). It may be appreciated that for a graded device, a thickness of the first dielectric 110 layer can match a thickness of the first S/D, a thickness of the third dielectric 120 layer can match a thickness of the graded regions between the first S/D and the channel region, and between the channel region and the second S/D.

Figure 5:
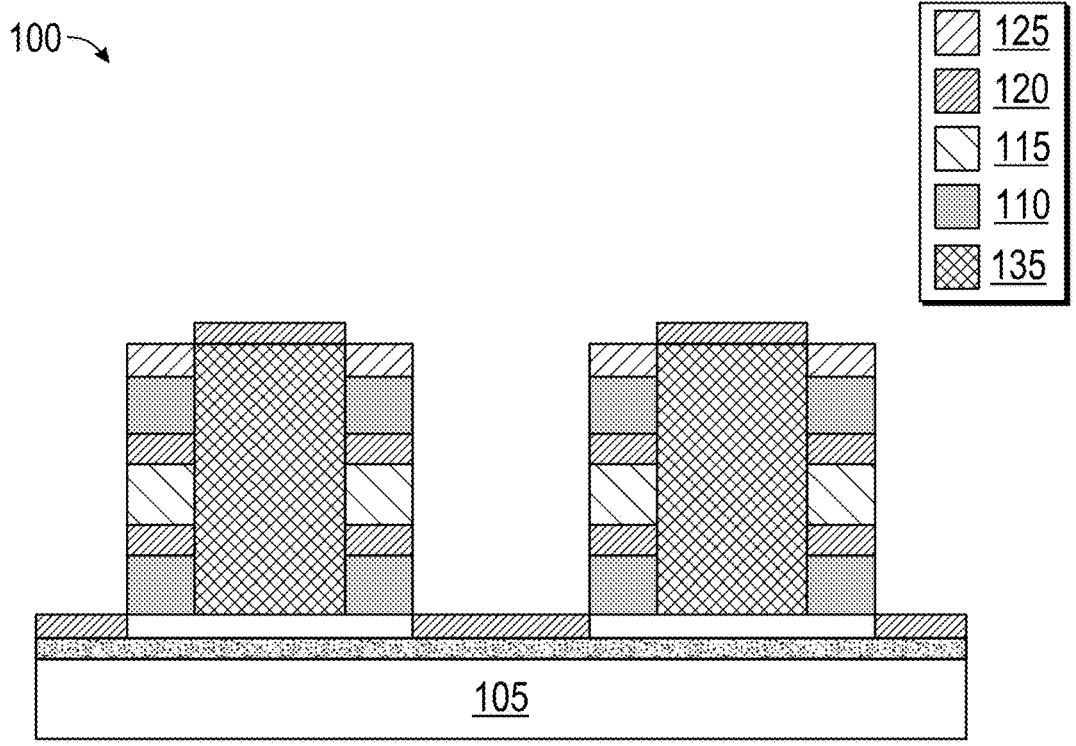
FIG. 5 is a cross-sectional substrate segment illustrating additional high-K material deposition, according to an embodiment of the present disclosure.

FIG. 5 is a cross-sectional substrate segment illustrating additional high-K material deposition, according to an embodiment of the present disclosure. In an embodiment, the third dielectric 120 can be a high-K material and can be selectively deposited on uncovered semiconductor material to protect regions of the substrate 105 as well as the uncovered end of the NMOS transistor 135. In an example, the deposition of the third dielectric 120 can be selective to the first dielectric 110.

Figure 6:
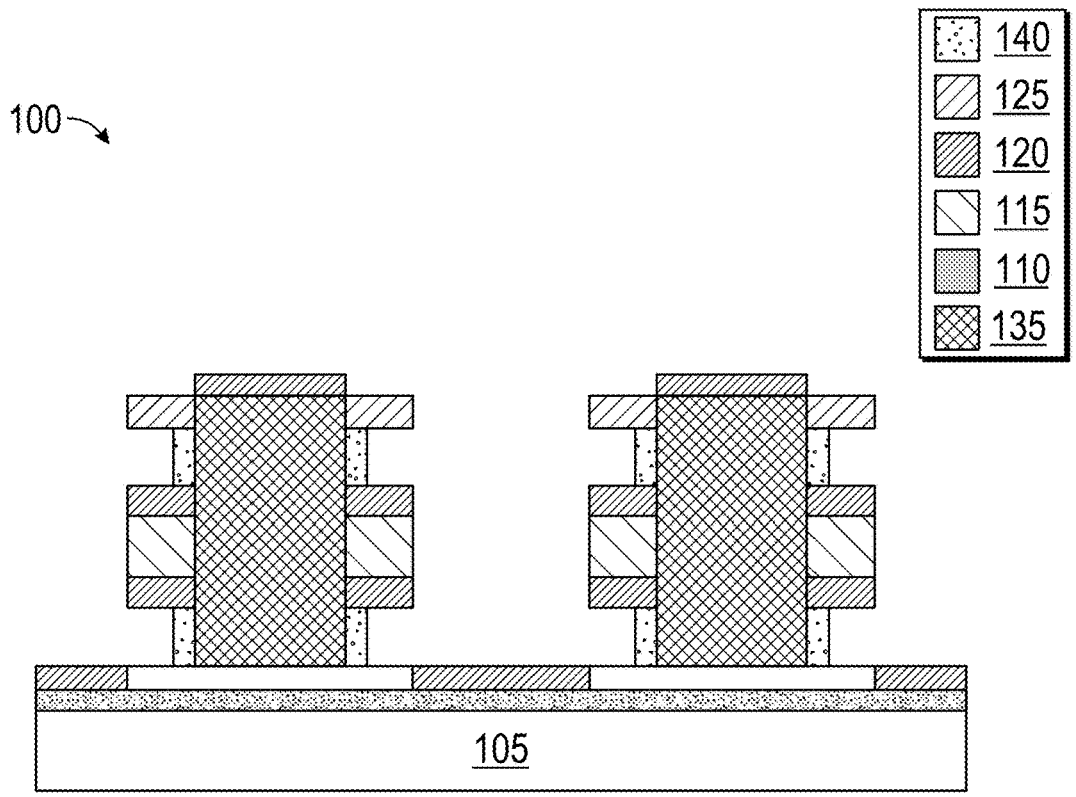
FIG. 6 is a cross-sectional substrate segment illustrating dielectric material removal, according to an embodiment of the present disclosure.

FIG. 6 is a cross-sectional substrate segment illustrating dielectric material removal, according to an embodiment of the present disclosure. In an embodiment, the first dielectric 110 can be removed to uncover regions for salicidation. Subsequently, the salicidation can be performed to form a metal silicide 140 serving as electrical contacts at predetermined locations on the NMOS transistor 135. The salicidation can includes selective deposition of a metal followed by a reacting anneal step to form the metal silicide 140 between the metal and silicon. Metals such as Ru, Ti, W and Co can be used for salicidation, among others.

Figure 7:
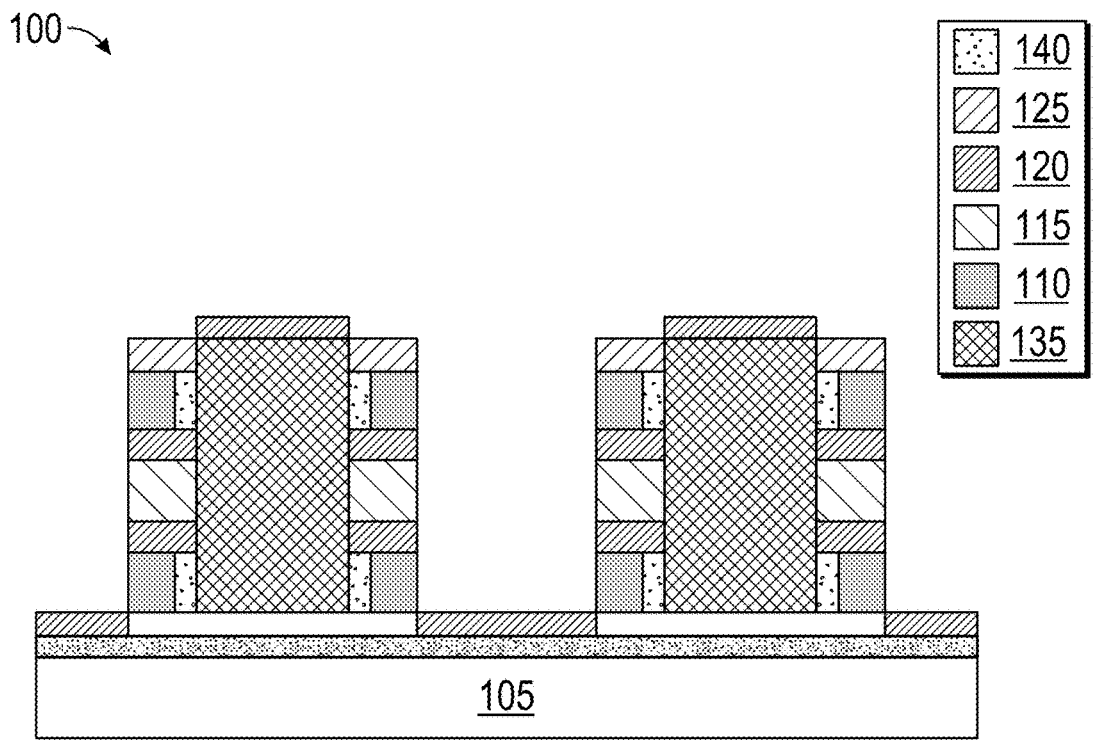
FIG. 7 is a cross-sectional substrate segment illustrating dielectric fill, according to an embodiment of the present disclosure.

FIG. 7 is a cross-sectional substrate segment illustrating dielectric fill, according to an embodiment of the present disclosure. In an embodiment, the first dielectric 110 can be deposited around the stack 100 to fill the areas where the first dielectric 110 was removed to uncover regions for the salicidation. After deposition, the excess first dielectric 110 can be etched to make the first dielectric 110 in the filled areas flush with the rest of the stack 100. The first dielectric 110 can thus protect the salicidation regions during dummy gate removal (i.e. during removal of the second dielectric 115).

Figure 8:
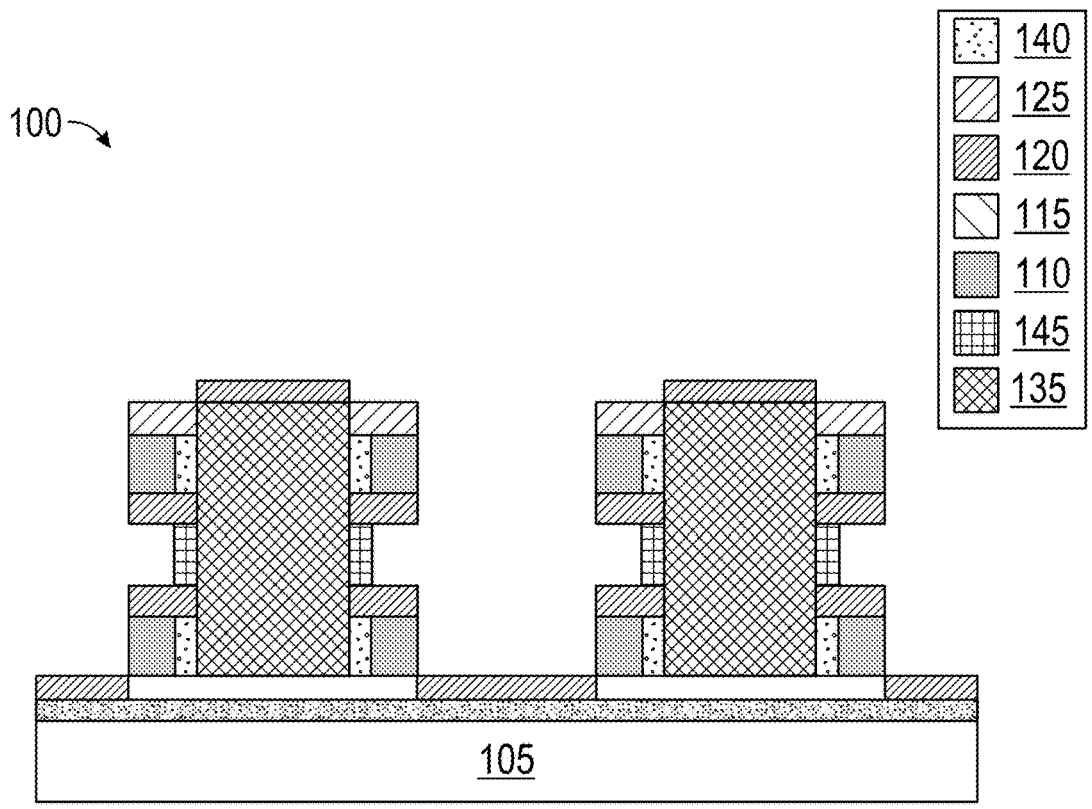
FIG. 8 is a cross-sectional substrate segment illustrating additional high-K material deposition, according to an embodiment of the present disclosure.

FIG. 8 is a cross-sectional substrate segment illustrating additional high-K material deposition, according to an embodiment of the present disclosure. In an embodiment, the second dielectric 115 acts as a dummy gate for the NMOS transistor 135. The second dielectric 115 can be removed to provide an opening or area for future gate stake regions. A cleaning of the future gate area is followed by selective deposition of a high-K material 145 in the uncovered channel regions.

Figure 9:
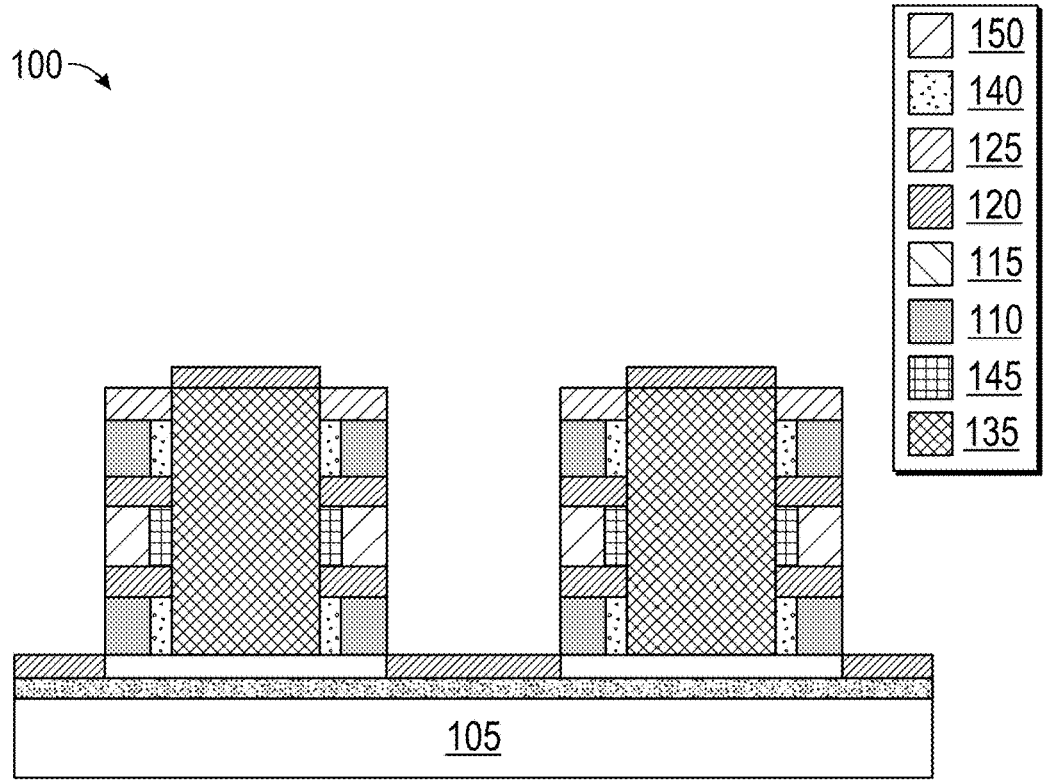
FIG. 9 is a cross-sectional substrate segment illustrating metal gate material deposition, according to an embodiment of the present disclosure.

FIG. 9 is a cross-sectional substrate segment illustrating metal gate material deposition, according to an embodiment of the present disclosure. In an embodiment, the metal gate material can be a n-type material and a NMOS metal gate stack 150 is formed on the high-K material 145 deposition. The growth can be a selective growth of the metal on the high-K material 145. It may be appreciated that the NMOS metal gate stack 150 can be combinations of various metals use for gate stacks. For example, more than one, more than two, or three or more different types of metals can be used. The NMOS metal gate stack 150 formation can result in an overburden of deposited metal (i.e. an excess exceeding the width of the adjacent layer stack of the dielectrics 110, 115, 120). A directional etch using the hardmask 125 for protection can trim the overburden, such as reactive ion etch (ME), plasma etch, or other anisotropic processes known in the art.

Figure 10:
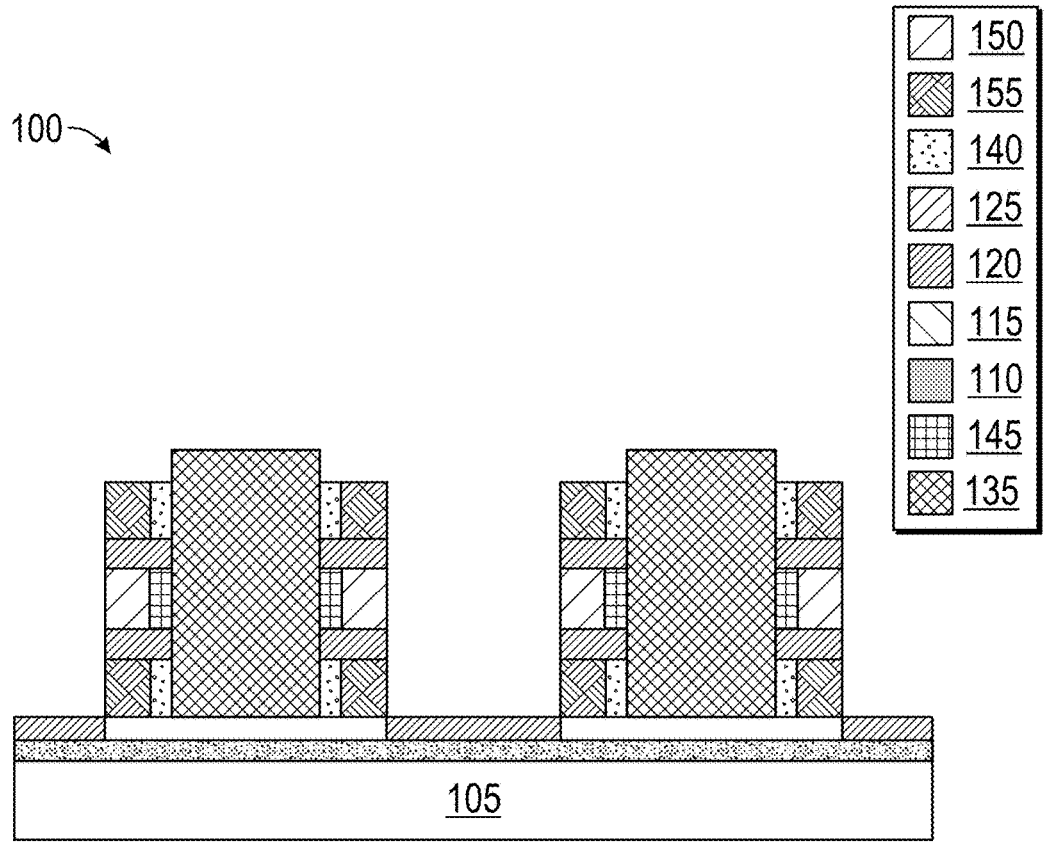
FIG. 10 is a cross-sectional substrate segment illustrating extension of the salicidation regions, according to an embodiment of the present disclosure.

FIG. 10 is a cross-sectional substrate segment illustrating extension of the salicidation regions, according to an embodiment of the present disclosure. In an embodiment, the first dielectric 110 can be removed, followed by deposition of an S/D metal 155, such as tungsten. The S/D metal 155 can be deposited to extend beyond the lateral width of the stack 100, after which a directional etch can be executed to align the extended lateral extensions of the salicided regions (i.e. the S/D metal 155) to the hardmask 125. Additionally, the hardmask 125 can be removed after the etch.

Figure 11:
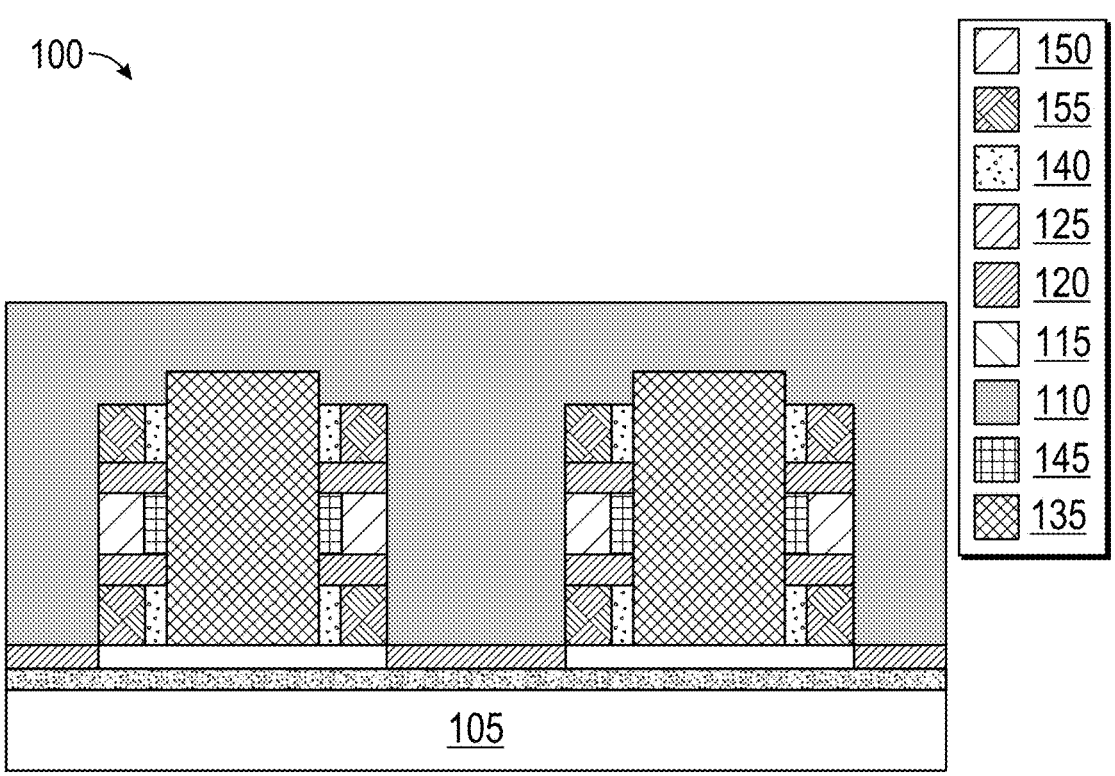
FIG. 11 is a cross-sectional substrate segment illustrating dielectric deposition, according to an embodiment of the present disclosure.

FIG. 11 is a cross-sectional substrate segment illustrating dielectric deposition, according to an embodiment of the present disclosure. In an embodiment, a dielectric, such as the first dielectric 110 (as shown), can be deposited across the substrate including the stack 100. The deposited first dielectric 110 can be planarized, for example via chemical-mechanical polishing (CMP), to remove any overburden. Furthermore, the S/D and gate regions can be connected with conductive connections, for example, local interconnects and interconnects to metal levels. In one example, a buried power rail (power rail positioned below the channels) can be incorporated, wherein a metal hookup can be obtained from either the top surface of the NMOS transistor 135, or using local interconnects.

A second process flow describes PMOS GAA nano transistor upright grown epi stacks complete with all junctions with substrate isolation.

In an embodiment, similar to FIG. 1, the stack 100 can include the substrate 105, the first dielectric 110 disposed overtop the oxide 195 on the substrate 105, the second dielectric 115 disposed overtop the first dielectric 110, the third dielectric 120 disposed overtop the second dielectric 115, and the hardmask 125 disposed overtop the third dielectric 120. Each dielectric 110, 115, 120 can be selective to each other. That is, any predetermined dielectric of the dielectrics 110, 115, 120 can be etched without substantially etching the remaining dielectric materials. The substrate 105 can be silicon with the oxide 195 on top of the silicon substrate 105, followed by additional silicon on top of the oxide 195. Materials for the hardmask 125 can be organic or inorganic. Examples of organic materials for the hardmask 125 can include amorphous carbon or organo siloxane-based materials with reflection control properties, among others. The organic hardmasks 125 can be formed by chemical vapor deposition (CVD) or spin-on processes. Examples of inorganic materials for the hardmask 125 can include SiN, SiON or TiN, among others. The inorganic hardmasks 125 can be deposited through CVD process. In other embodiments, the oxide 195 can be any semiconductor stack, such as silicon/oxide/Ge or silicon/oxide/SiGe, among others. A top surface of the substrate 105 can be any type of semiconductor.

In an embodiment, the etch mask 130 can be formed on the stack 100 and subsequently patterned using photolithography. The etch mask 130 can be used to create openings in the stack 100 via, for example, etching, for future vertical-flow transistor channels or upright nanostack devices to be grown epitaxially within. That is, the etching process can form recesses where the etch mask 130 is not protecting the material below. Thus, the stack 100 can be etched through the first dielectric 110, the second dielectric 115, and the third dielectric 120 layers until uncovering a layer of semiconductor material, such as silicon or Ge on the oxide 195. The etch mask 130 can be removed and the stack 100 can be cleaned.

Figure 12:
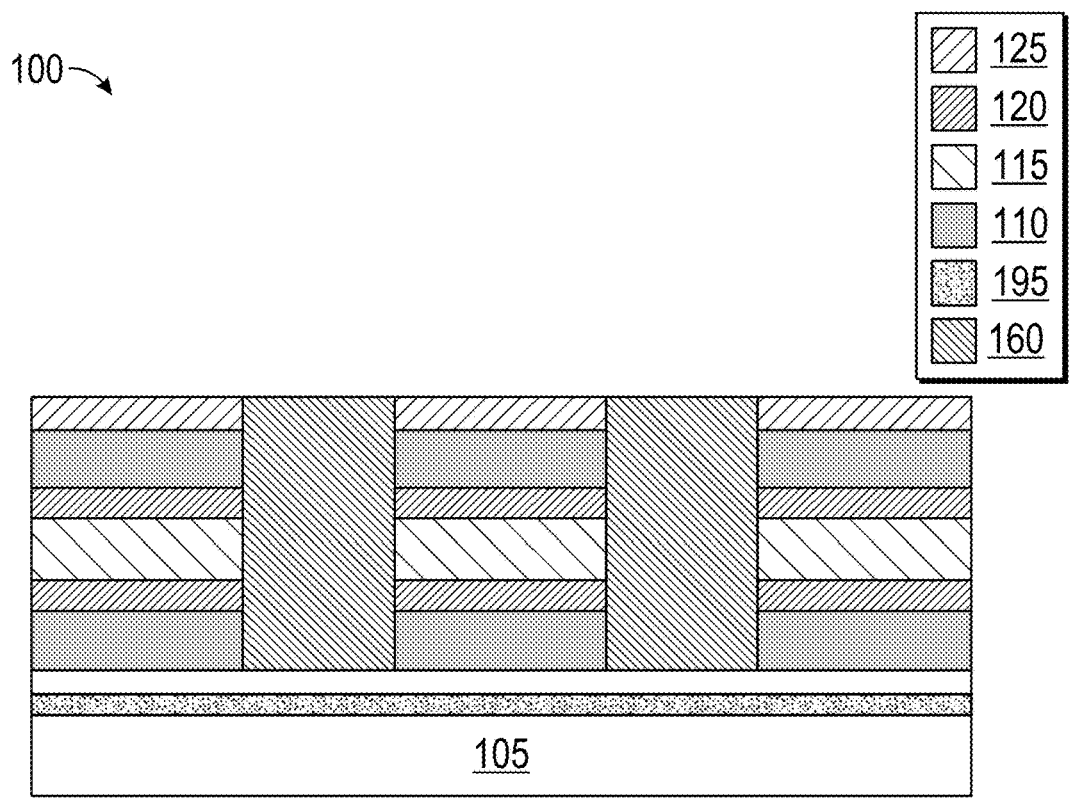
FIG. 12 is a cross-sectional substrate segment illustrating device formation, according to an embodiment of the present disclosure.

FIG. 12 is a cross-sectional substrate segment illustrating device formation, according to an embodiment of the present disclosure. In an embodiment, devices can be grown in the recesses defined by the etch. For example, a PMOS graded epitaxial device stack 160 (herein referred to as "PMOS transistor 160") can be grown in the openings. As shown, the PMOS transistor 160 is uniform, but via the method of fabrication disclosed herein, the PMOS transistor 160 can be fabricated with a gradation as material is deposited from one end to another. The PMOS transistor 160 can be formed via an in-situ process, such as epitaxial growth. For example, P-doped epitaxial material acting as a first source/drain (S/D) can be grown. N-epi or intrinsic material can be grown for a channel region on the first S/D. Then, P-doped epitaxial material acting as a second S/D can be grown. Accordingly, a complete, doped PMOS transistor 160 can be formed in one in-situ epitaxial growth process. That is, more generally, a vertically-grown, epitaxial structure can be formed. P-type dopants can be, for example, boron or indium, among others. N-type dopants can be, for example, arsenic or phosphorous, among others. Materials for the channel in the PMOS transistor 160 can be, for example, Si or SiGe, among others.

Figure 13:
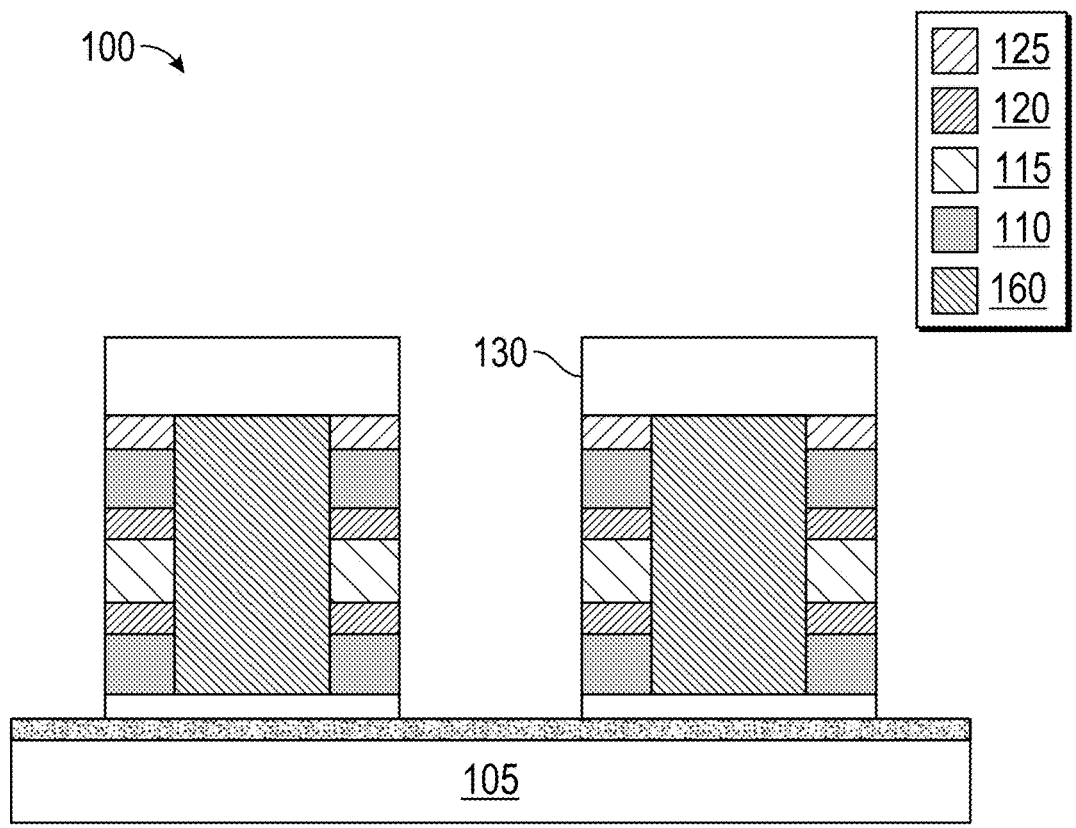
FIG. 13 is a cross-sectional substrate segment illustrating device definition, according to an embodiment of the present disclosure.

FIG. 13 is a cross-sectional substrate segment illustrating device definition, according to an embodiment of the present disclosure. In an embodiment, the etch mask 130 can be formed and patterned again to cover the newly grown PMOS transistor 160. Notably, the etch mask 130 can extend a distance exceeding the lateral width of the PMOS transistor 160 to form an overhang. The etch mask 130 can be formed to etch dielectric material on the substrate 105 while leaving a thickness of the dielectric stack around (or on sides of) the upright PMOS transistor 160. A directional (anisotropic) etch can be executed to remove uncovered portions of the stack 100 such that a portion of an adjacent layer stack of the dielectrics 110, 115, 120 remains on either side (or all sides) of the upright PMOS transistor 160. As previously described, upright can mean perpendicular to the working surface of the substrate 105.

In an embodiment, the etch mask 130 can be removed to reveal the PMOS transistor 160 including the portion of the adjacent layer stack of the dielectrics 110, 115, 120. The third dielectric 120 can be a high-K material and can be selectively deposited on uncovered semiconductor material to protect regions of the substrate 105 as well as the uncovered end of the PMOS transistor 160. In an example, the deposition of the third dielectric 120 can be selective to the first dielectric 110.

Figure 14:
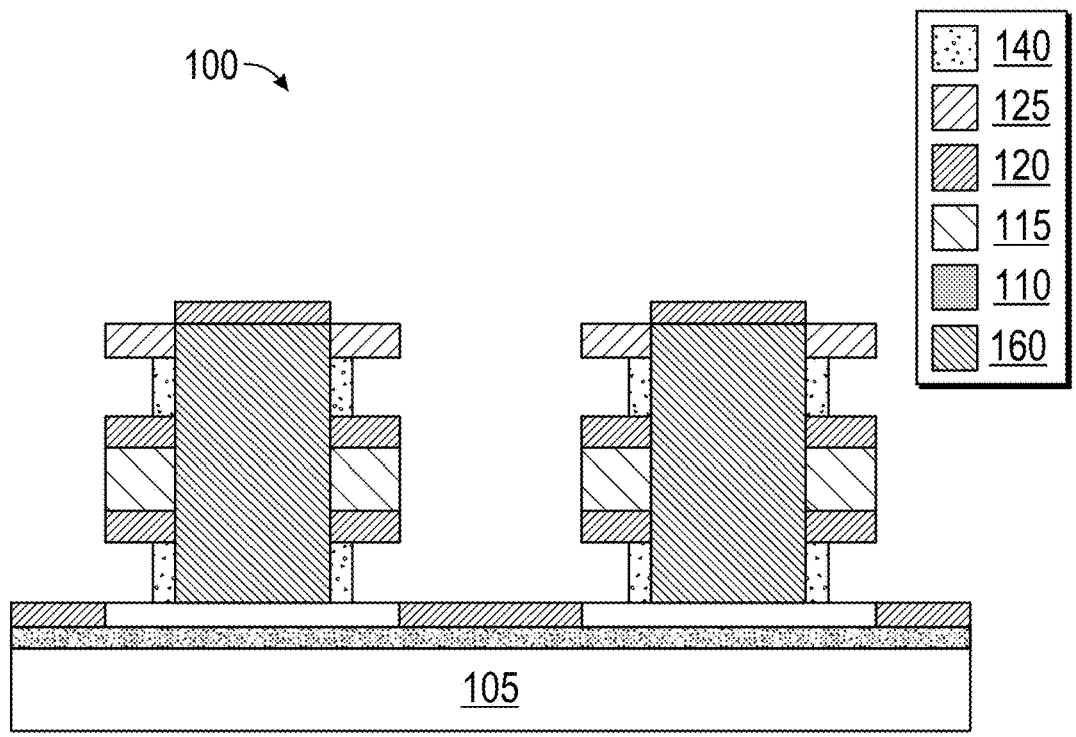
FIG. 14 is a cross-sectional substrate segment illustrating dielectric material removal, according to an embodiment of the present disclosure.

FIG. 14 is a cross-sectional substrate segment illustrating dielectric material removal, according to an embodiment of the present disclosure. In an embodiment, the first dielectric 110 can be removed to uncover regions for salicidation. Subsequently, the salicidation can be performed to form the metal silicide 140 serving as electrical contacts at predetermined locations on the PMOS transistor 160. The salicidation can includes selective deposition of a metal followed by a reacting anneal step to form the metal silicide 140 between the metal and silicon. Metals such as Ru, Ti, W and Co can be used for salicidation, among others.

Figure 15:
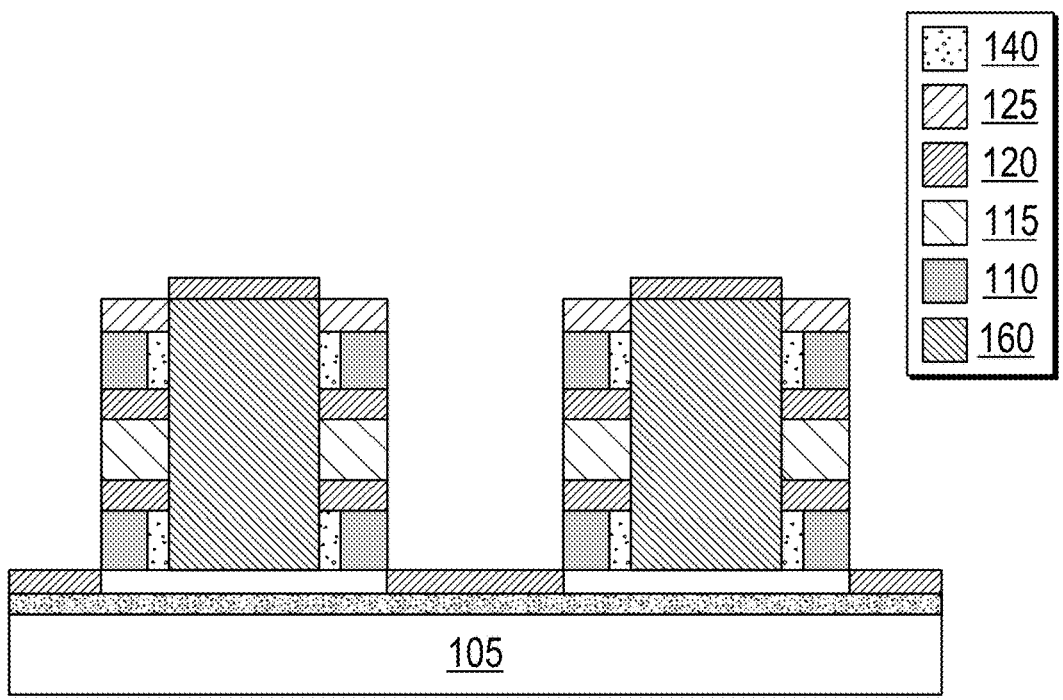
FIG. 15 is a cross-sectional substrate segment illustrating dielectric fill, according to an embodiment of the present disclosure.

FIG. 15 is a cross-sectional substrate segment illustrating dielectric fill, according to an embodiment of the present disclosure. In an embodiment, the first dielectric 110 can be deposited around the stack 100 to fill the areas where the first dielectric 110 was removed to uncover regions for the salicidation. After deposition, the excess first dielectric 110 can be etched to make the first dielectric 110 in the filled areas flush with the rest of the stack 100. The first dielectric 110 can thus protect the salicidation regions during dummy gate removal (i.e. during removal of the second dielectric 115). The second dielectric 115 can act as a dummy gate for the PMOS transistor 160. The second dielectric 115 can be removed to provide an opening or area for future gate stake regions.

Figure 16:
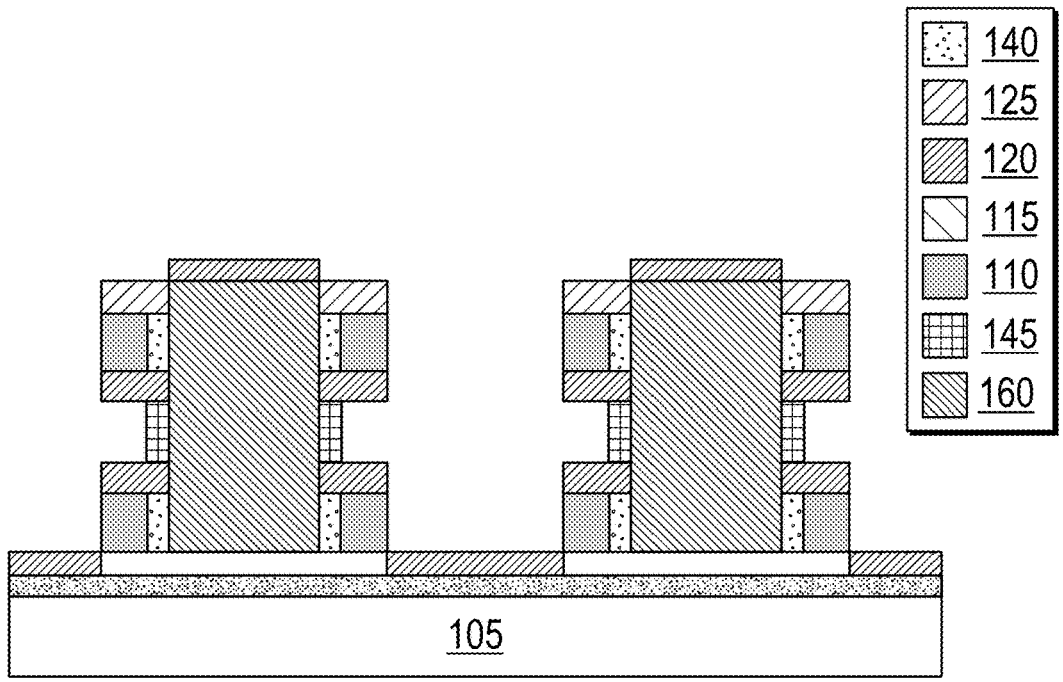
FIG. 16 is a cross-sectional substrate segment illustrating additional high-K material deposition, according to an embodiment of the present disclosure.

FIG. 16 is a cross-sectional substrate segment illustrating additional high-K material deposition, according to an embodiment of the present disclosure. In an embodiment, a cleaning of the future gate area is followed by selective deposition of the high-K material 145 in the uncovered channel regions.

Figure 17:
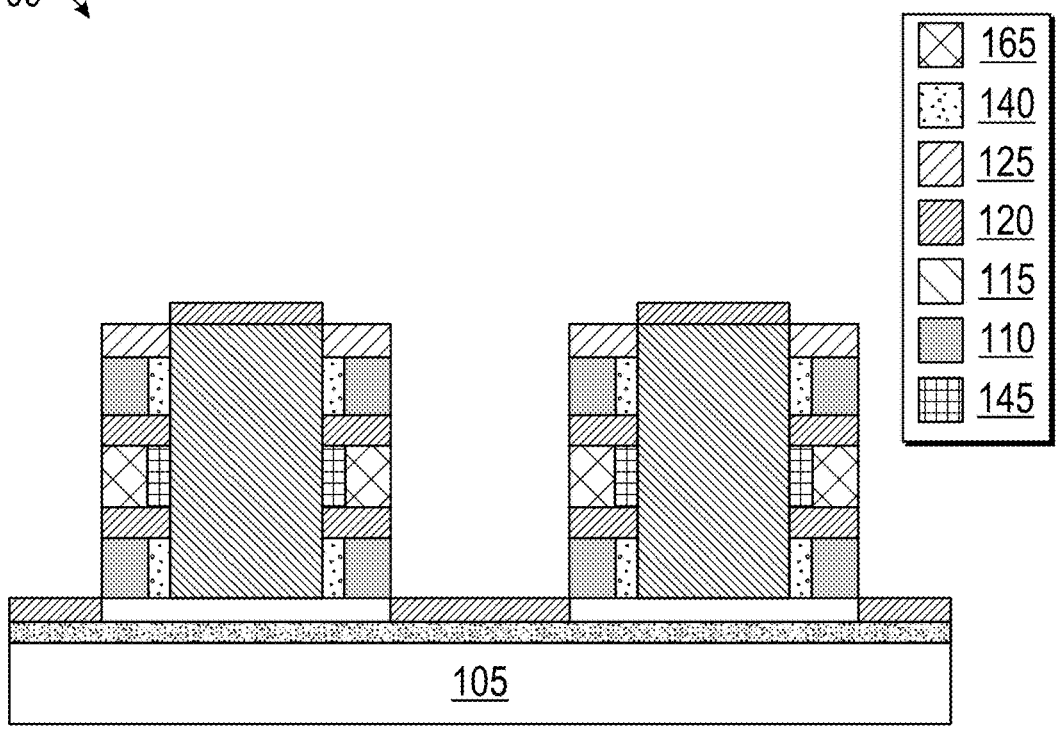
FIG. 17 is a cross-sectional substrate segment illustrating metal gate material deposition, according to an embodiment of the present disclosure.

FIG. 17 is a cross-sectional substrate segment illustrating metal gate material deposition, according to an embodiment of the present disclosure. In an embodiment, the metal gate material can be a p-type material and a PMOS metal gate stack 165 is formed on the high-K material 145 deposition. The growth can be a selective growth of the metal on the high-K material 145. It may be appreciated that the PMOS metal gate stack 165 can be combinations of various metals use for gate stacks. For example, more than one, more than two, or three or more different types of metals can be used. The PMOS metal gate stack 165 formation can result in an overburden of deposited metal (i.e. an excess exceeding the width of the adjacent layer stack of the dielectrics 110, 115, 120). A directional etch using the hardmask 125 for protection can trim the overburden, such as reactive ion etch (RIE), plasma etch, or other anisotropic processes known in the art.

Figure 18:
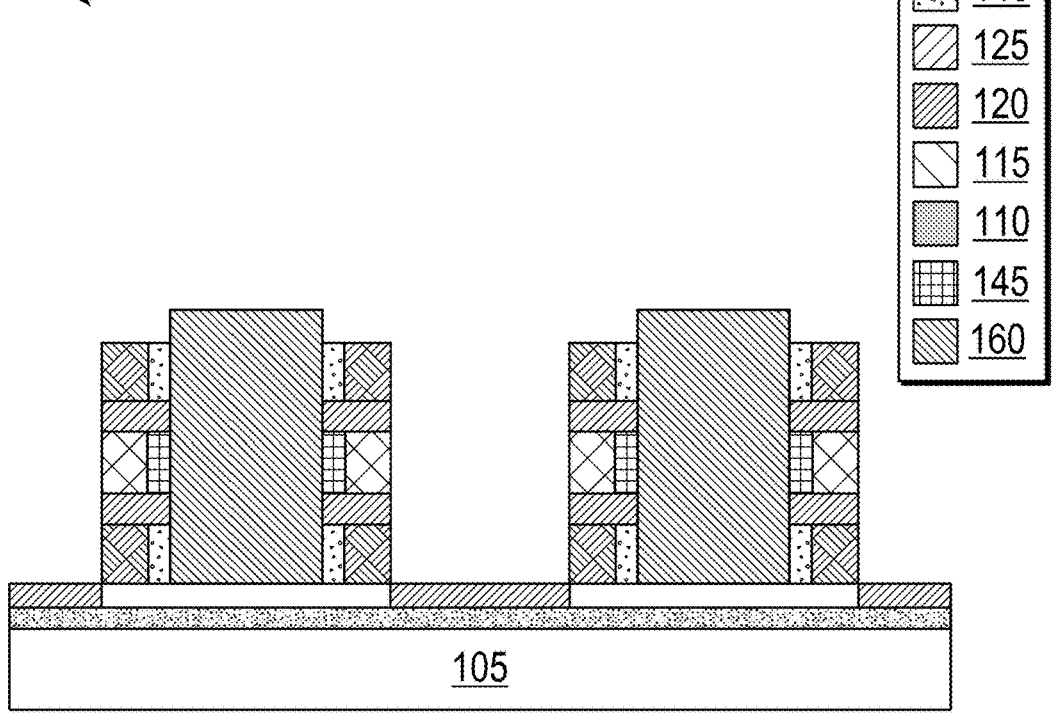
FIG. 18 is a cross-sectional substrate segment illustrating extension of the salicidation regions, according to an embodiment of the present disclosure.

FIG. 18 is a cross-sectional substrate segment illustrating extension of the salicidation regions, according to an embodiment of the present disclosure. In an embodiment, the first dielectric 110 can be removed, followed by deposition of the S/D metal 155, such as tungsten. The S/D metal 155 can be deposited to extend beyond the lateral width of the stack 100, after which a directional etch can be executed to align the extended lateral extensions of the salicided regions (i.e. the S/D metal 155) to the hardmask 125. Additionally, the hardmask 125 can be removed after the etch.

Figure 19:
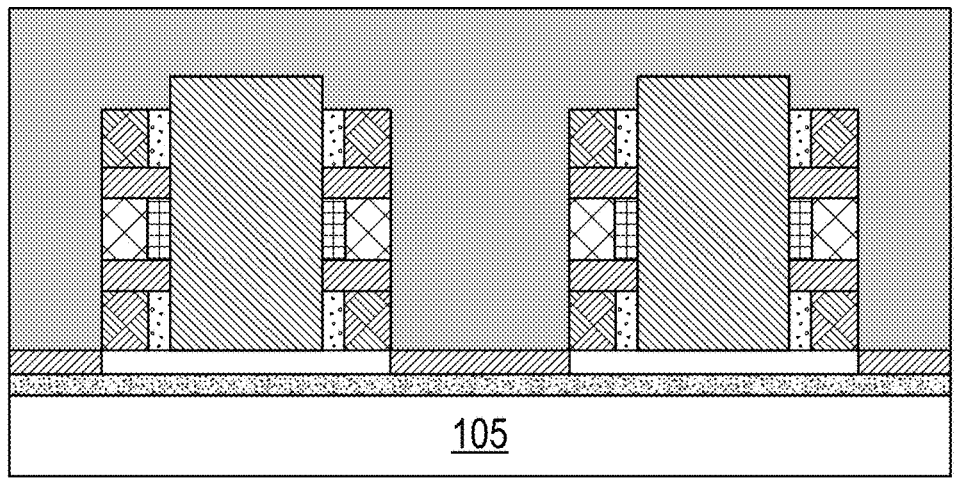
FIG. 19 is a cross-sectional substrate segment illustrating dielectric deposition, according to an embodiment of the present disclosure.

FIG. 19 is a cross-sectional substrate segment illustrating dielectric deposition, according to an embodiment of the present disclosure. In an embodiment, a dielectric, such as the first dielectric 110 (as shown), can be deposited across the substrate including the stack 100. The deposited first dielectric 110 can be planarized, for example via chemical-mechanical polishing (CMP), to remove any overburden. Furthermore, the S/D and gate regions can be connected with conductive connections, for example, local interconnects and interconnects to metal levels. In one example, a buried power rail (power rail positioned below the channels) can be incorporated, wherein a metal hookup can be obtained from either the top surface of the PMOS transistor 160, or using local interconnects.

A third process flow describes the NMOS GAA nano transistor upright grown epi stack grown adjacent to the PMOS GAA nano transistor upright grown epi stack (complete with all junctions with substrate isolation) for a 3D CMOS device layout design. In brief, the general process flow for the third process flow is similar to that for fabrication of the NMOS-only or the PMOS-only first and second process flows, except that additional masking steps are added to separately form the NMOS transistor 135 and the PMOS transistor 160. For example, openings for both the NMOS transistor 135 and the PMOS transistor 160 are initially formed and filled with dielectric, then dummy-filled PMOS openings are masked while NMOS openings are uncovered to grow the NMOS transistor 135. After, NMOS regions are covered while the PMOS openings are uncovered to grow the PMOS transistor 160. It may be appreciated that the process can begin with masking the dummy-filled NMOS openings while PMOS openings are uncovered to grow the PMOS transistor 160 first. A more detailed explanation of the former is described herein.

In an embodiment, similar to FIG. 1, the stack 100 can include the substrate 105, the first dielectric 110 disposed overtop the oxide 195 on the substrate 105, the second dielectric 115 disposed overtop the first dielectric 110, the third dielectric 120 disposed overtop the second dielectric 115, and the hardmask 125 disposed overtop the third dielectric 120. Each dielectric 110, 115, 120 can be selective to each other. The etch mask 130 can be formed on the stack 100 and subsequently patterned using photolithography. The etch mask 130 can be used to create openings in the stack 100 via, for example, etching, for future vertical-flow transistor channels or upright nanostack devices to be grown epitaxially within. The stack 100 can be etched through the first dielectric 110, the second dielectric 115, and the third dielectric 120 layers until uncovering a layer of semiconductor material, such as silicon or Ge on the oxide 195. The etch mask 130 can be removed and the stack 100 can be cleaned.

Figure 20:
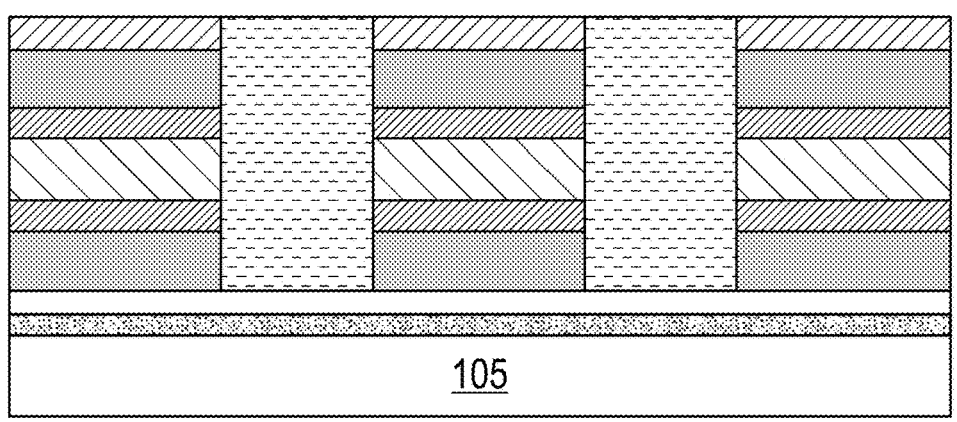
FIG. 20 is a cross-sectional substrate segment illustrating dielectric deposition, according to an embodiment of the present disclosure.

FIG. 20 is a cross-sectional substrate segment illustrating dielectric deposition, according to an embodiment of the present disclosure. In an embodiment, a fourth dielectric 170 can be deposited in the openings created by the etch and act as a dummy fill. The deposited fourth dielectric 170 can then be subject to a CMP for planarization.

Figure 21:
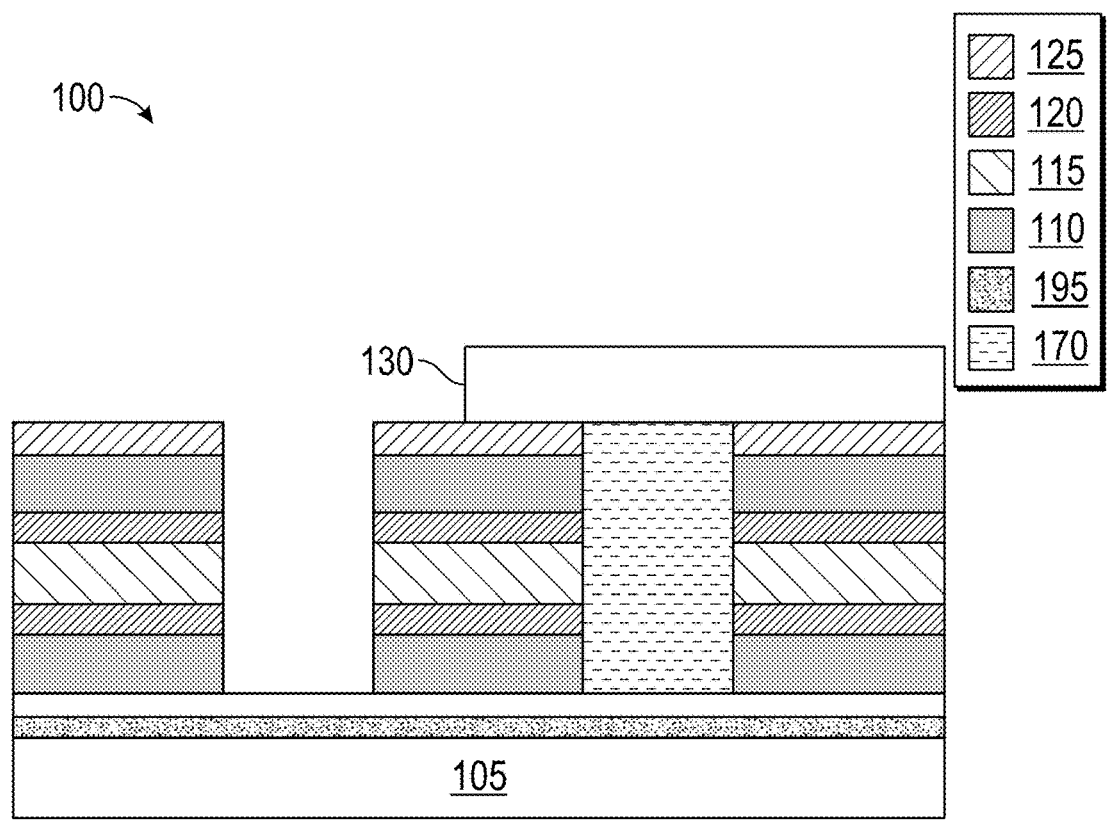
FIG. 21 is a cross-sectional substrate segment illustrating removing one of the dummy fills, according to an embodiment.

FIG. 21 is a cross-sectional substrate segment illustrating removing one of the dummy fills, according to an embodiment. In an embodiment, the etch mask 130 can be deposited over top and localized to one of the dummy-filled openings. As shown, the etch mask 130 is formed over the right dummy-filled opening. As such, the etch mask 130 protects the right dummy-filled opening while an etch removes the fourth dielectric 170 from the left opening.

Figure 22:
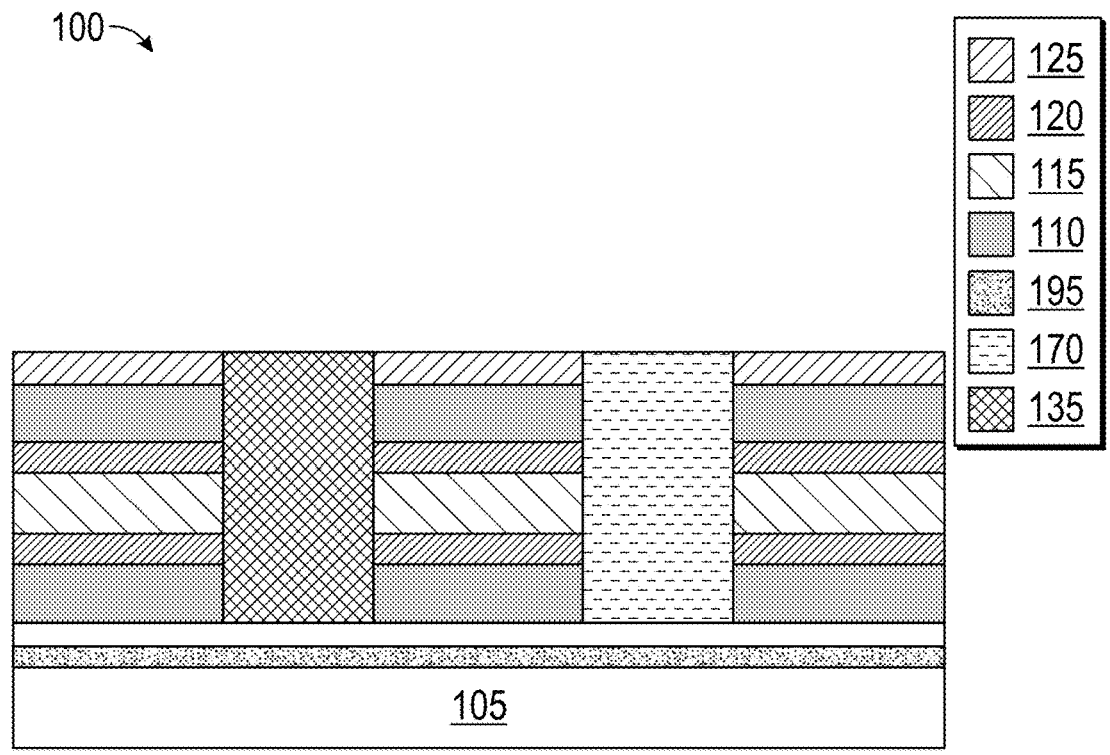
FIG. 22 is a cross-sectional substrate segment illustrating device formation, according to an embodiment.

FIG. 22 is a cross-sectional substrate segment illustrating device formation, according to an embodiment. In an embodiment, a first device is formed. For example, the NMOS transistor 135 is formed in the left opening via in-situ epitaxial growth. As shown, the NMOS transistor 135 is uniform, but it may be appreciated that the NMOS transistor 135 can be graded as previously described. For example, N-doped epitaxial material acting as the first source/drain (S/D) can be grown. P-epi or intrinsic material can be grown for the channel region on the first S/D. Then, N-doped epitaxial material acting as the second S/D can be grown. N-type dopants can be, for example, arsenic or phosphorous, among others. P-type dopants can be, for example, boron or indium, among others.

After, the etch mask 130 can be removed from overtop the right dummy-filled opening and the first dielectric 110 is deposited overtop the stack 100. The etch mask 130 is deposited overtop the NMOS transistor 135 (which is under the layer of the first dielectric 110) and first dielectric 110 is removed from overtop the right dummy-filled opening. Subsequently, with the fourth dielectric 170 material exposed, the fourth dielectric 170 can be removed from the right opening and the PMOS transistor 160 can be grown in the right opening. As shown, the PMOS transistor 160 is uniform, but it may be appreciated that the PMOS transistor 160 can be graded as previously described. The PMOS transistor 160 can be formed via an in-situ process, such as epitaxial growth. For example, P-doped epitaxial material acting as a first source/drain (S/D) can be grown. N-epi or intrinsic material can be grown for a channel region on the first S/D. Then, P-doped epitaxial material acting as a second S/D can be grown. Accordingly, a complete, doped PMOS transistor 160 can be formed in one in-situ epitaxial growth process. P-type dopants can be, for example, boron or indium, among others. N-type dopants can be, for example, arsenic or phosphorous, among others. Materials for the channel in the PMOS transistor 160 can be, for example, Si or SiGe, among others.

Figure 23:
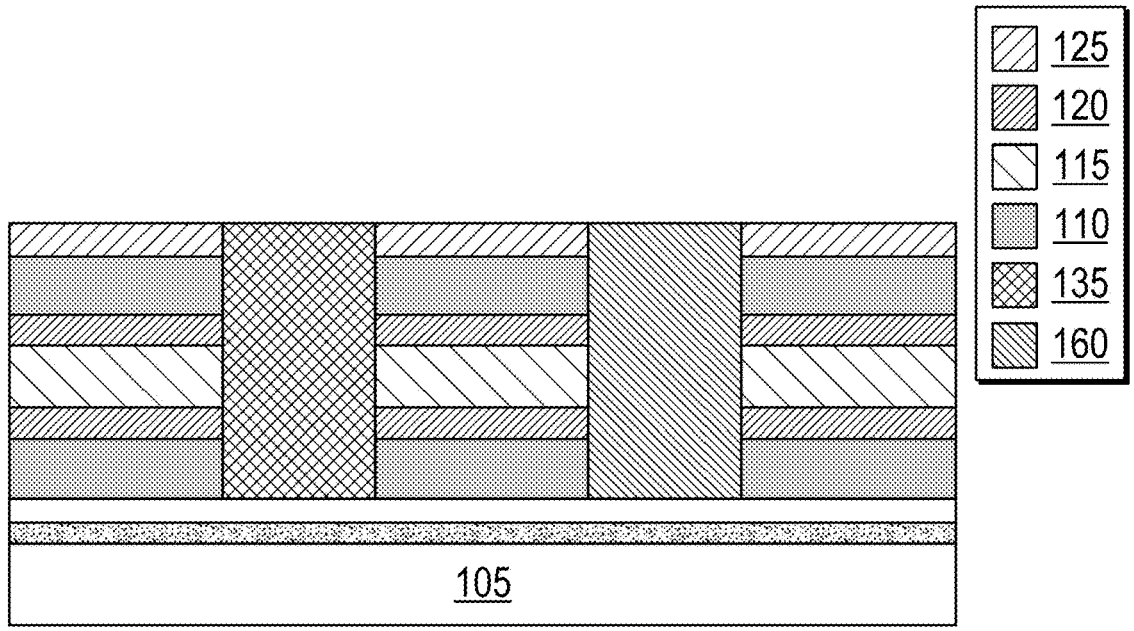
FIG. 23 is a cross-sectional substrate segment illustrating removal of the first dielectric overtop the stack, according to an embodiment.

FIG. 23 is a cross-sectional substrate segment illustrating removal of the first dielectric 110 overtop the stack 100, according to an embodiment. In an embodiment, the etch mask 130 can be removed prior to or after forming the PMOS transistor 160. Subsequently, the first dielectric 110 overtop the NMOS transistor 135 can also be removed.

Figure 24:
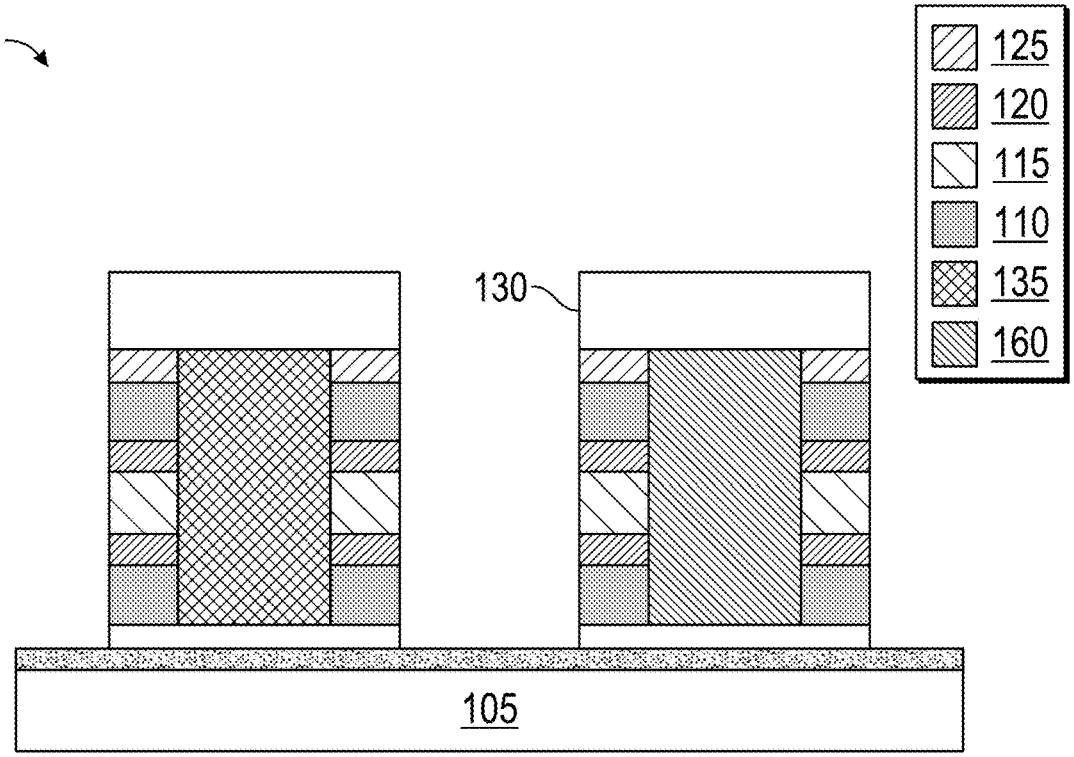
FIG. 24 is a cross-sectional substrate segment illustrating device definition, according to an embodiment of the present disclosure.

FIG. 24 is a cross-sectional substrate segment illustrating device definition, according to an embodiment of the present disclosure. In an embodiment, the etch mask 130 can be formed and patterned again to cover the newly grown NMOS transistor 135 and PMOS transistor 160. Notably, the etch mask 130 can extend a distance exceeding the lateral width of the NMOS transistor 135 and PMOS transistor 160 to form an overhang. The etch mask 130 can be formed to etch dielectric material on the substrate 105 while leaving a thickness of the dielectric stack around (or on sides of) the upright NMOS transistor 135 and PMOS transistor 160. A directional (anisotropic) etch can be executed to remove uncovered portions of the stack 100 such that a portion of an adjacent layer stack of the dielectrics 110, 115, 120 remains on either side (or all sides) of the upright NMOS transistor 135 and PMOS transistor 160. As previously described, upright can mean perpendicular to the working surface of the substrate 105. The etch mask 130 can then be removed to reveal the NMOS transistor 135 and PMOS transistor 160 including the portion of the adjacent layer stack of the dielectrics 110, 115, 120.

Figure 25:
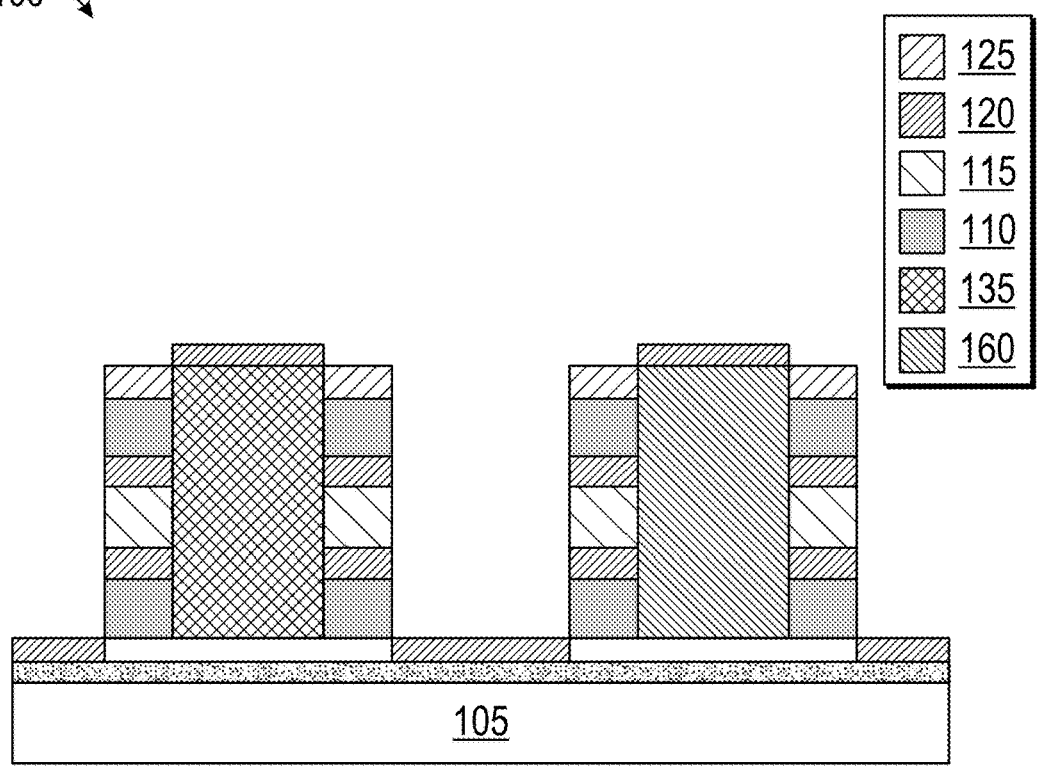
FIG. 25 is a cross-sectional substrate segment illustrating additional high-K material deposition, according to an embodiment of the present disclosure.

FIG. 25 is a cross-sectional substrate segment illustrating additional high-K material deposition, according to an embodiment of the present disclosure. In an embodiment, the third dielectric 120 can be a high-K material and can be selectively deposited on uncovered semiconductor material to protect regions of the substrate 105 as well as the uncovered end of the NMOS transistor 135 and PMOS transistor 160. In an example, the deposition of the third dielectric 120 can be selective to the first dielectric 110.

In an embodiment, the first dielectric 110 can be removed to uncover the regions for salicidation. Subsequently, the salicidation can be performed to form the metal silicide 140 serving as electrical contacts at predetermined locations on the NMOS transistor 135 and PMOS transistor 160. The salicidation can includes selective deposition of a metal followed by a reacting anneal step to form the metal silicide 140 between the metal and silicon. Metals such as Ru, Ti, W and Co can be used for salicidation, among others.

Figure 26:
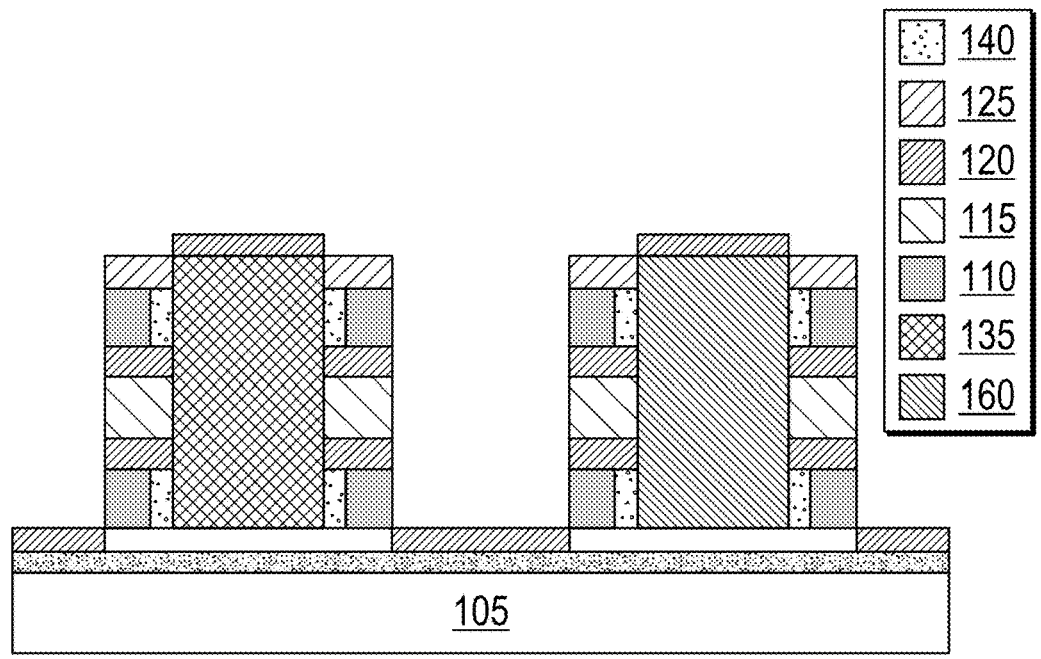
FIG. 26 is a cross-sectional substrate segment illustrating dielectric fill, according to an embodiment of the present disclosure.

FIG. 26 is a cross-sectional substrate segment illustrating dielectric fill, according to an embodiment of the present disclosure. In an embodiment, the first dielectric 110 can be deposited around the stack 100 to fill the areas where the first dielectric 110 was removed to uncover regions for the salicidation. After deposition, the excess first dielectric 110 can be etched to make the first dielectric 110 in the filled areas flush with the rest of the stack 100. The first dielectric 110 can thus protect the salicidation regions during dummy gate removal (i.e. during removal of the second dielectric 115).

Figure 27:
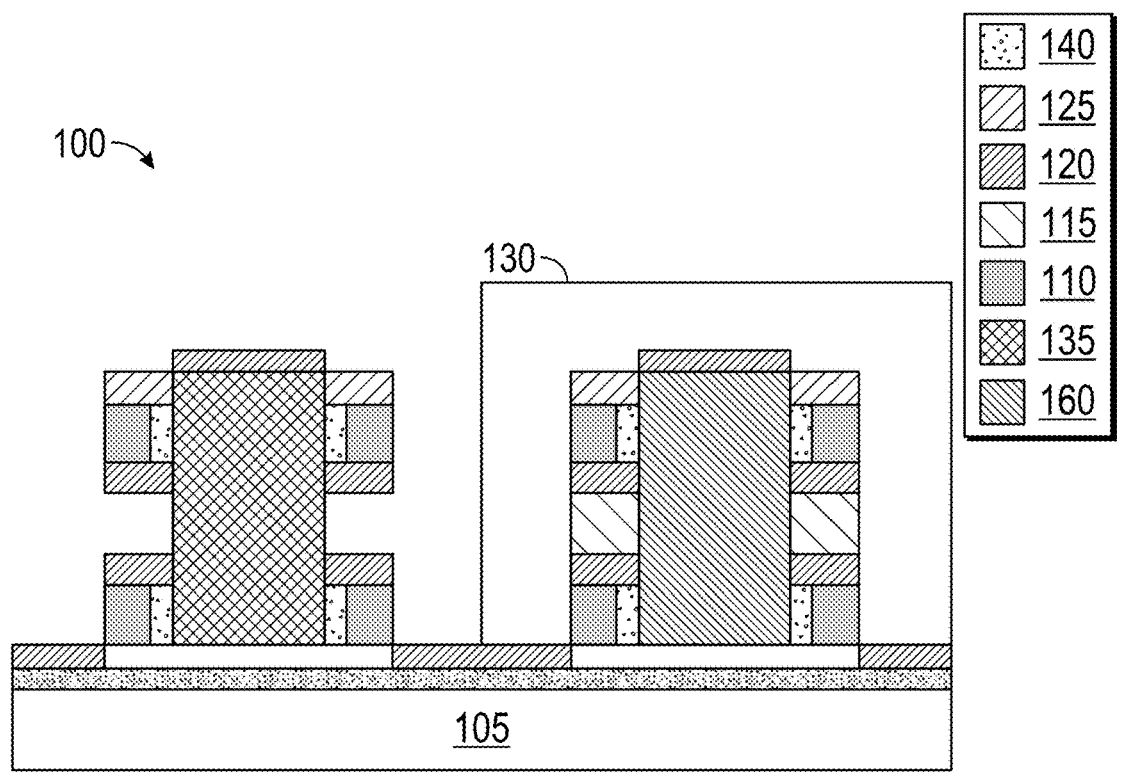
FIG. 27 is a cross-sectional substrate segment illustrating dummy gate removal, according to an embodiment of the present disclosure.

FIG. 27 is a cross-sectional substrate segment illustrating dummy gate removal, according to an embodiment of the present disclosure. In an embodiment, the second dielectric 115 acts as a dummy gate for the NMOS transistor 135. The etch mask 130 can be deposited around the PMOS transistor 160 stack on the right. Subsequently, the second dielectric 115 can be removed from the NMOS transistor 135 stack to provide an opening or area for future gate stake regions in the NMOS transistor 135.

In an embodiment, the etch mask 130 around the PMOS transistor 160 stack is removed and a cleaning of the future gate area is followed by selective deposition of the high-K material 145 in the uncovered channel regions of the NMOS transistor 135 (as described previously). Subsequently, the NMOS metal gate stack 150 is formed on the high-K material 145 of the NMOS transistor 135. The growth can be a selective growth of the metal on the high-K material 145.

It may be appreciated that the NMOS metal gate stack 150 can be combinations of various metals use for gate stacks. For example, more than one, more than two, or three or more different types of metals can be used. An overburden of the NMOS metal gate stack 150 material is shown, which can be removed and trimmed with a directional etch.

Figure 28:
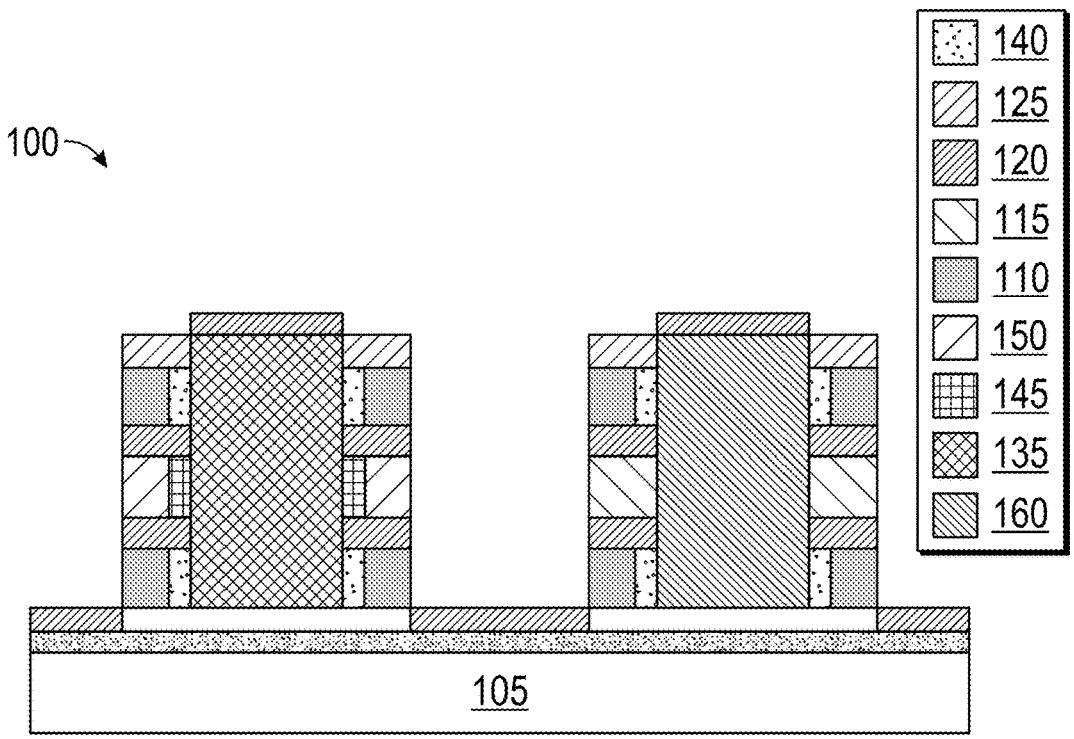
FIG. 28 is a cross-sectional substrate segment illustrating removal of the overburden, according to an embodiment of the present disclosure.

FIG. 28 is a cross-sectional substrate segment illustrating removal of the overburden, according to an embodiment of the present disclosure. In an embodiment, the NMOS metal gate stack 150 material is removed and trimmed with the directional etch to align the NMOS metal gate stack 150 with the NMOS transistor 135 stack.

Figure 29:
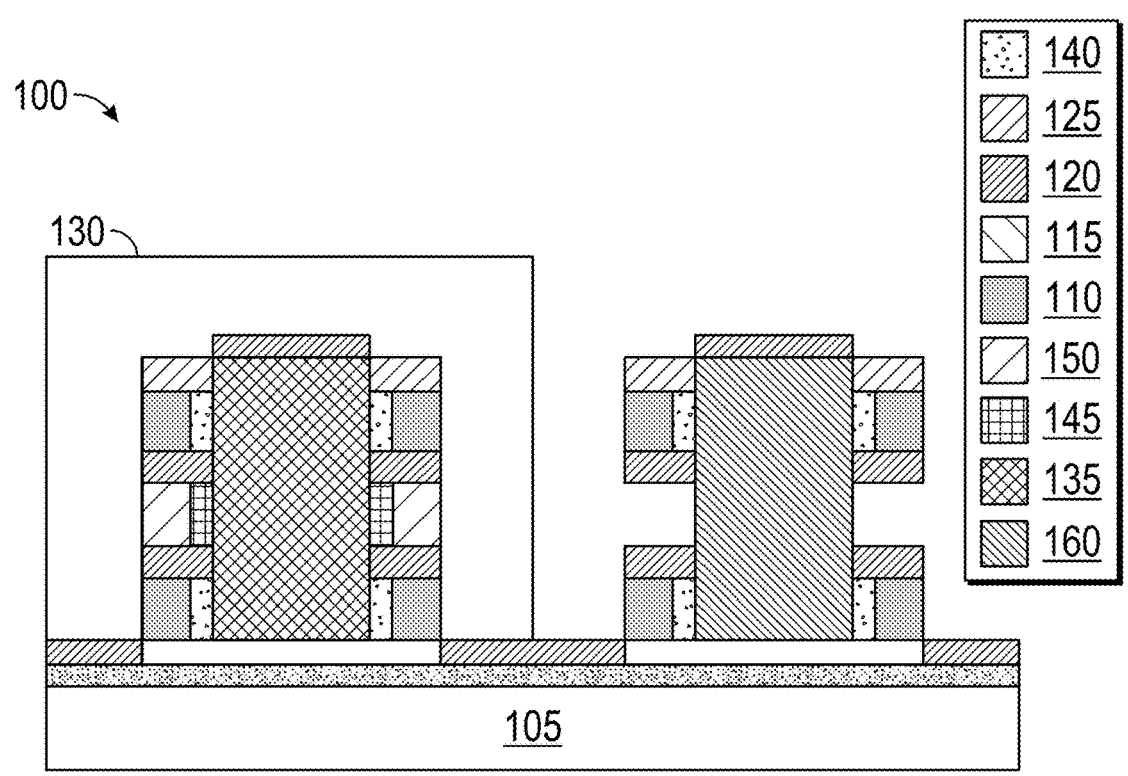
FIG. 29 is a cross-sectional substrate segment illustrating dummy gate removal for the other device, according to an embodiment of the present disclosure.

FIG. 29 is a cross-sectional substrate segment illustrating dummy gate removal for the other device, according to an embodiment of the present disclosure. In an embodiment, the second dielectric 115 acts as a dummy gate for the PMOS transistor 160. The etch mask 130 can be deposited around the NMOS transistor 135 stack on the left. Subsequently, the second dielectric 115 can be removed from the PMOS transistor 160 stack to provide an opening or area for future gate stake regions in the PMOS transistor 160. The etch mask 130 around the NMOS transistor 135 stack is removed and a cleaning of the future gate area is followed by selective deposition of the high-K material 145 in the uncovered channel regions of the PMOS transistor 160. Subsequently, the PMOS metal gate stack 165 is formed on the high-K material 145 of the PMOS transistor 160. The growth can be a selective growth of the metal on the high-K material 145. It may be appreciated that the PMOS metal gate stack 165 can be combinations of various metals use for gate stacks. For example, more than one, more than two, or three or more different types of metals can be used. An overburden of the PMOS metal gate stack 165 can be removed and trimmed with a directional etch.

Figure 30:
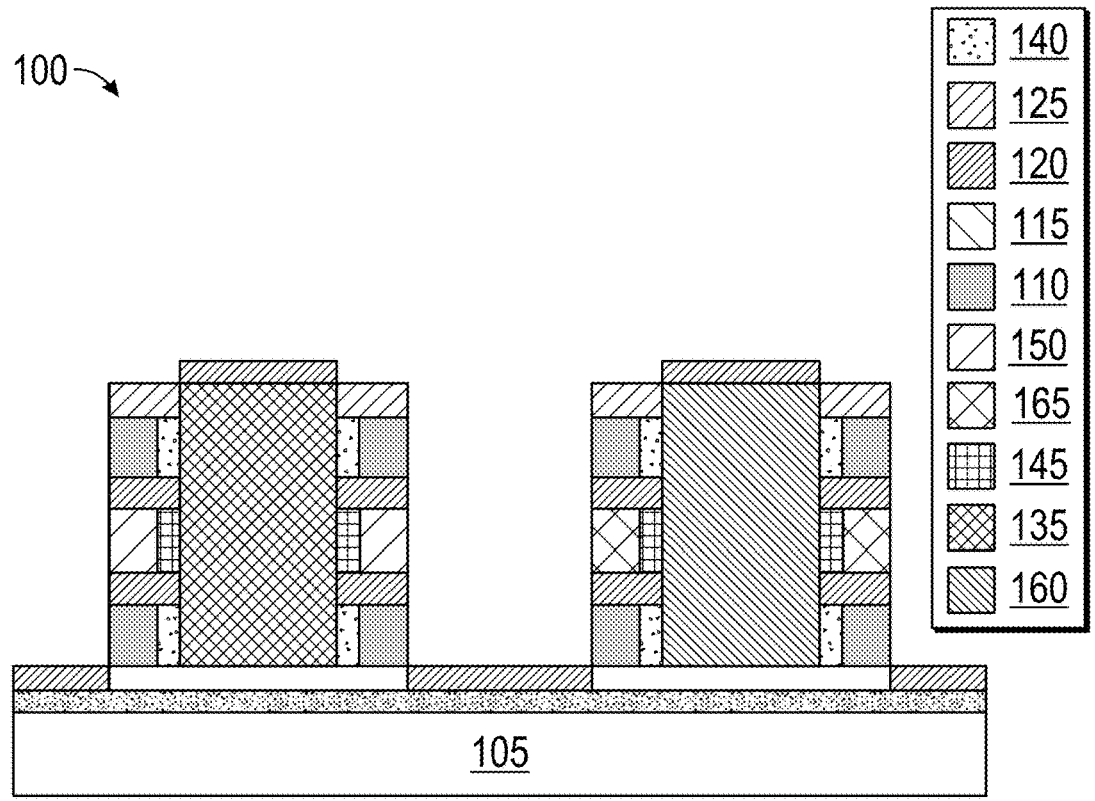
FIG. 30 is a cross-sectional substrate segment illustrating removal of the overburden, according to an embodiment of the present disclosure.

FIG. 30 is a cross-sectional substrate segment illustrating post-removal of the overburden, according to an embodiment of the present disclosure. In an embodiment, the PMOS metal gate stack 165 material is removed and trimmed with the directional etch to align the PMOS metal gate stack 165 with the PMOS transistor 160 stack.

Figure 31:
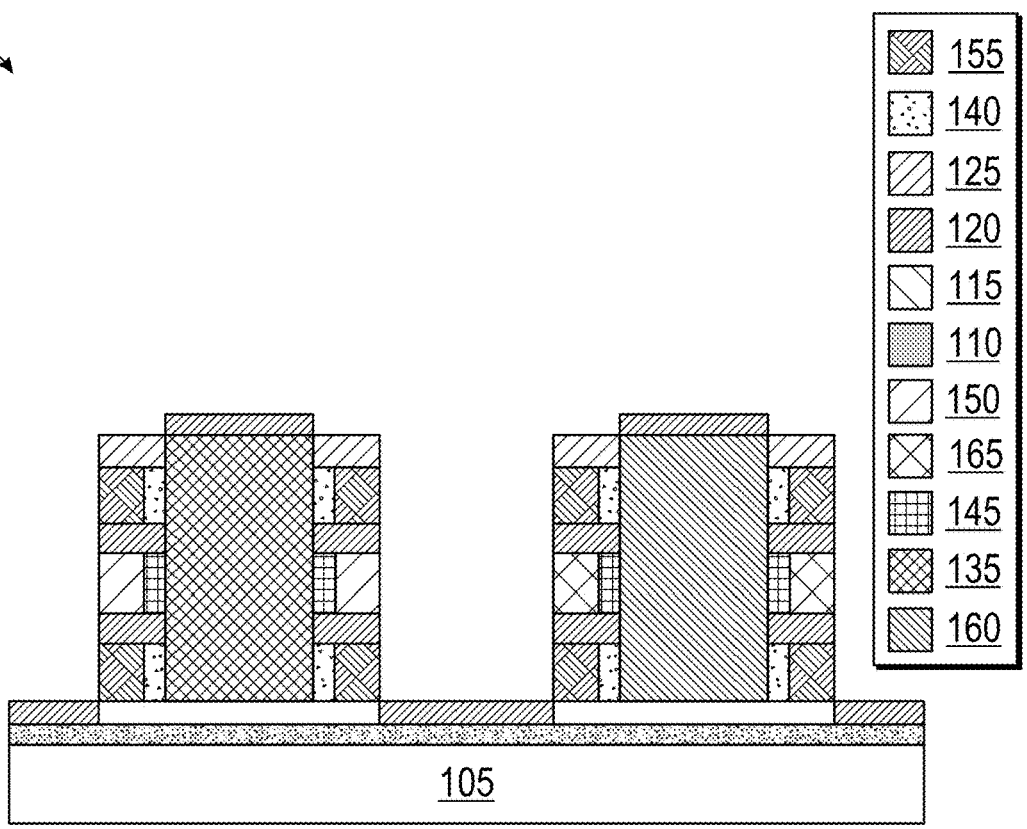
FIG. 31 is a cross-sectional substrate segment illustrating extension of the salicidation regions, according to an embodiment of the present disclosure.

FIG. 31 is a cross-sectional substrate segment illustrating extension of the salicidation regions, according to an embodiment of the present disclosure. In an embodiment, the first dielectric 110 can be removed from both the NMOS transistor 135 stack and the PMOS transistor 160 stack, followed by deposition of the S/D metal 155, such as tungsten. The S/D metal 155 can be deposited to extend beyond the lateral width of the stack 100, after which a directional etch can be executed to align the extended lateral extensions of the salicided regions (i.e. the S/D metal 155) to the hardmask 125. Additionally, the hardmask 125 can be removed after the etch.

Figure 32:
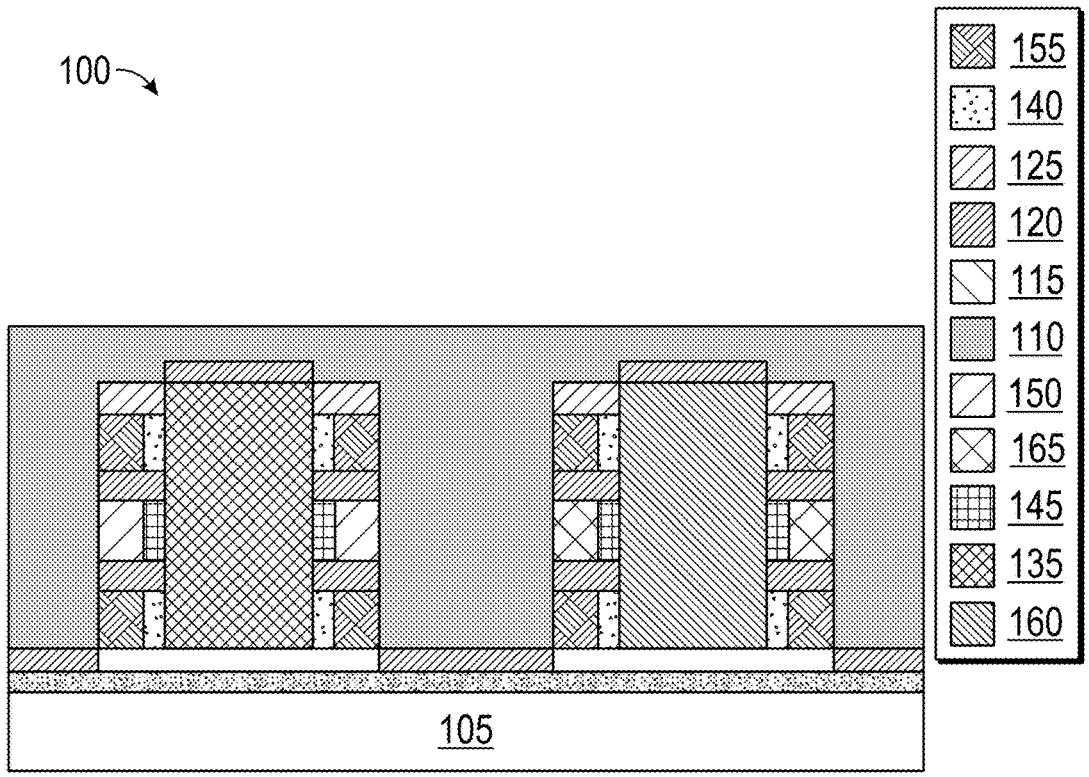
FIG. 32 is a cross-sectional substrate segment illustrating dielectric deposition, according to an embodiment of the present disclosure.

FIG. 32 is a cross-sectional substrate segment illustrating dielectric deposition, according to an embodiment of the present disclosure. In an embodiment, a dielectric, such as the first dielectric 110 (as shown), can be deposited across the substrate including the stack 100. The deposited first dielectric 110 can be planarized, for example via chemical-mechanical polishing (CMP), to remove any overburden. Furthermore, the S/D and gate regions can be connected with conductive connections, for example, local interconnects and interconnects to metal levels. In one example, a buried power rail (power rail positioned below the channels) can be incorporated, wherein a metal hookup can be obtained from either the top surface of the NMOS transistor 135 and PMOS transistor 160, or using local interconnects. Accordingly, all of the S/Ds and gate can be formed and defined by epitaxial growth, and oriented vertically to provide optimized scaling.

Figure 33:
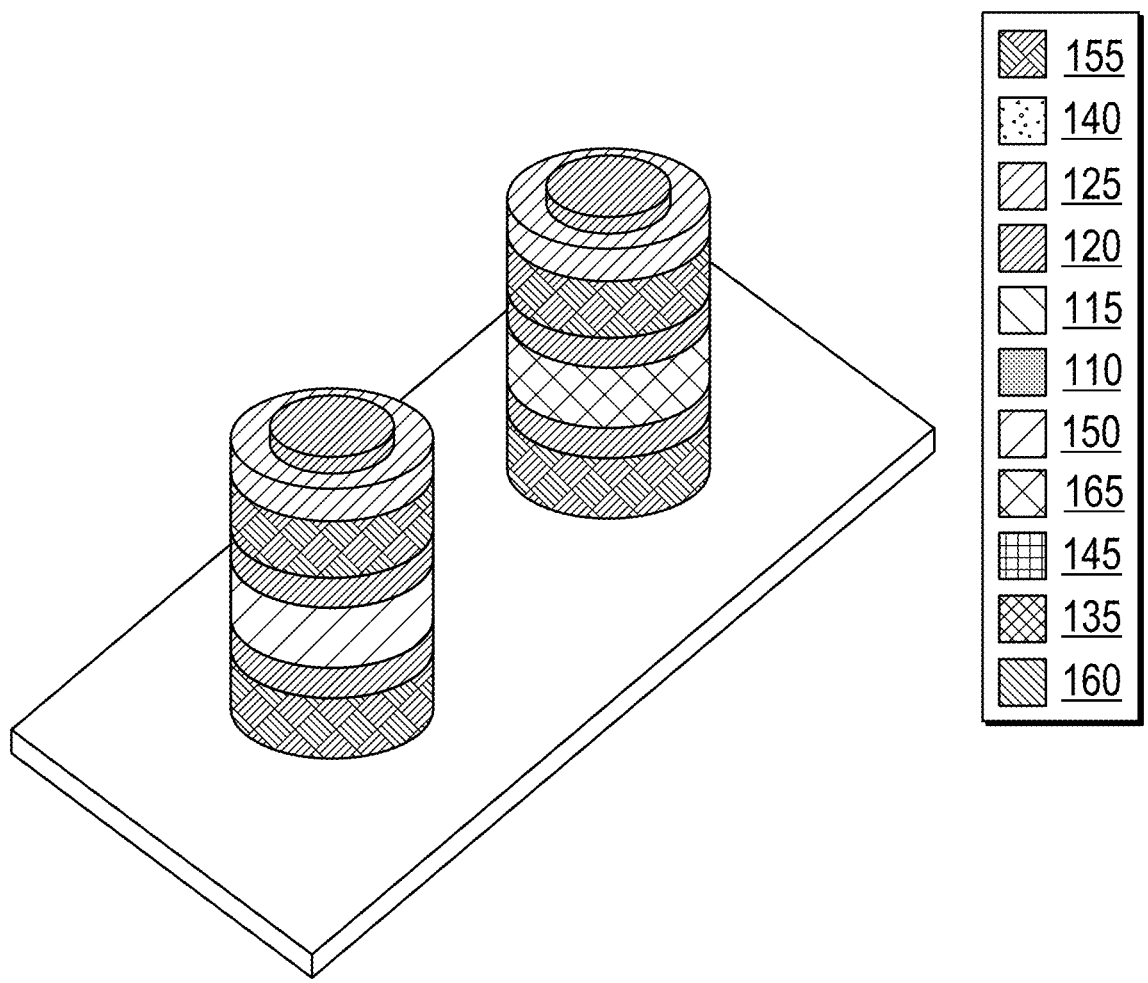
FIG. 33 is a perspective view schematic of the NMOS transistor stack and the PMOS transistor stack surrounded by the S/D regions and the respective metal gates, according to an embodiment of the present disclosure.

FIG. 33 is a perspective view schematic of the NMOS transistor 135 stack and the PMOS transistor 160 stack surrounded by the S/D regions and the respective metal gates, according to an embodiment of the present disclosure. As shown, the first dielectric is not deposited over the stacks, which adopt a cylindrical shape. It may be appreciated that other volumetric shapes for the stacks can be contemplated. However, the cylindrical shape shown provides rotational symmetry. The conductive connections can be easily fabricated to connect to any angle around the stacks.

Figure 34:
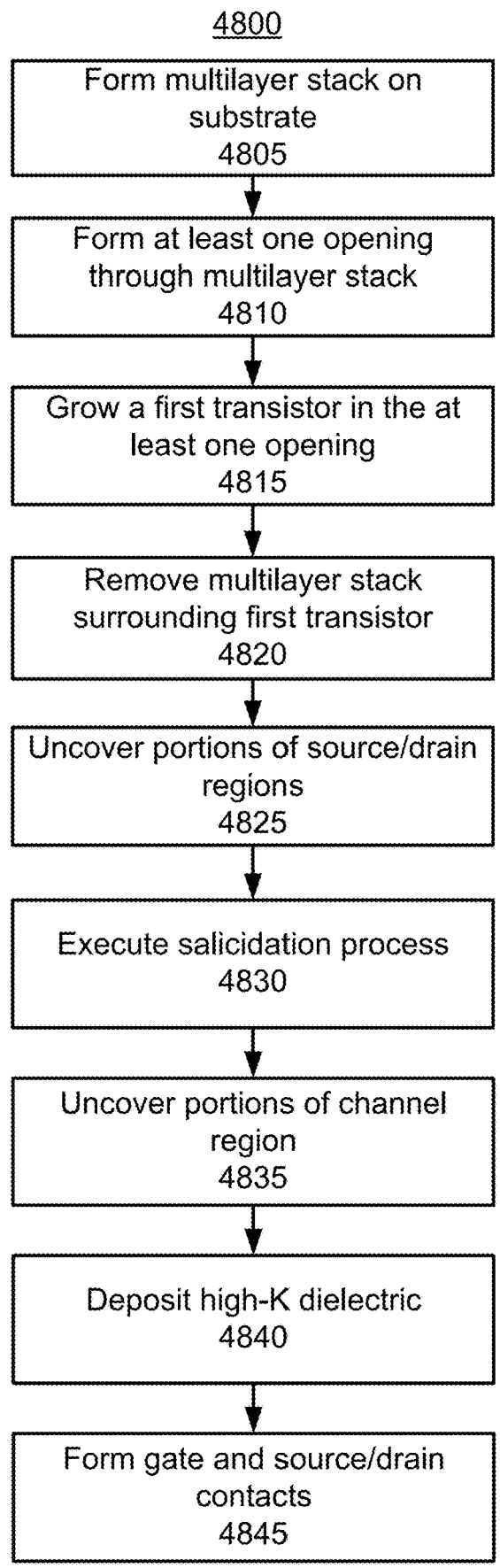
FIG. 34 is a flow chart for a method of fabricating a semiconductor device, according to an embodiment of the present disclosure.

FIG. 34 is a flow chart for a method 4800 of fabricating a semiconductor device, according to an embodiment of the present disclosure. In step 4805, the multilayer stack 100 is formed on a surface of the substrate 105, the multilayer stack 100 including: the first dielectric 110 disposed overtop the oxide 195 on the substrate 105, the second dielectric 115 disposed overtop the first dielectric 110, the third dielectric 120 disposed overtop the second dielectric 115, and the hardmask 125 disposed overtop the third dielectric 120. In step 4810, an opening is formed through the layers of the dielectrics 110, 115, 120 to the substrate 105. In step 4815, the NMOS transistor 135 and/or the PMOS transistor 160 is grown in the opening. In step 4820, the NMOS transistor 135 and/or the PMOS transistor 160 is isolated by removing portions of the multilayer stack 100 surrounding the NMOS transistor 135 and/or the PMOS transistor 160 while leaving some of the layers of the dielectrics 110, 115, 120 surrounding and adjacent to the NMOS transistor 135 and/or the PMOS transistor 160. In step 4825, portions of the source/drain regions are uncovered. In step 4830, a salicidation process is executed to form metal silicides at uncovered sidewalls of the NMOS transistor 135 and/or the PMOS transistor 160 source/drain regions. In step 4835, portions of the channel region are uncovered. In step 4840, a deposition process is executed to deposit high-K dielectric at uncovered sidewalls of the channel region. In step 4845, gate and source/drain contacts are formed on the high-K dielectric and metal silicides, respectively.

The methods described detail formation of a complete, upright/vertical NMOS and/or PMOS transistor and include numerous advantages. In one advantage, separate control of channel doping is provided. In one advantage, the transistors can have 360 degree symmetry for device connections, thus providing more points of access for future connections to the devices. In one advantage, improved Idsat is provided with optimum device layout. In one advantage, the method provides maximum scaling for the channel region since the channel thickness can be controlled by deposition as opposed to photolithography. In one advantage, the transistors are fabricated in a 3D vertical dimension, thus enhancing the density of the silicon circuit. In one advantage, the methods described enable a robust process flow compatible with 3D memory, 3D logic, and high performance logic and thus can be used with any type of device used in 3D logic. In one advantage, precise alignment of the gate electrode is provided with few processing steps having fine control of layer deposition thickness. In one advantage, precise alignment of the spacer regions is provided as well.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, comprising:
    forming a multilayer stack on a surface of a substrate, the multilayer stack including a first dielectric material in a first layer, a second dielectric material in a second layer, and a third dielectric material in a third layer, any one of the first dielectric material, the second dielectric material, and the third dielectric material being selective to the other dielectric materials;
    forming at least one opening through the multilayer stack to the surface of the substrate; and
    growing a first transistor in a first opening of the at least one opening, the first transistor including a first source/drain region proximal to the substrate, a channel region disposed vertically overtop the first source/drain region, and a second source/drain region disposed vertically overtop the channel region on a side of the channel region distal to the substrate, wherein the multilayer stack includes alternating layers of the first dielectric material in the first layer, the second dielectric material in the second layer, and the third dielectric material in the third layer.

2. The method of claim 1, wherein the first transistor is grown using a single epitaxial growth sequence that results in the first source/drain region transitioning into the channel region and the channel region transitioning into the second source/drain region.

3. The method of claim 2, wherein epitaxially growing the first transistor further comprises:
    executing a first epitaxy process with a first dopant that forms the first source/drain region proximal to the substrate, the first source/drain region being doped with the first dopant;
    executing a second epitaxy process to form the channel region vertically overtop the first source/drain region, a thickness of the channel region controlled by the second epitaxy process; and
    executing a third epitaxy process with the first dopant to form the second source/drain region vertically overtop the channel region, the second source/drain region being doped with the first dopant.

4. The method of claim 3, wherein epitaxially growing the first transistor further comprises overlapping the first epitaxy process and the second epitaxy process such that a gradient transition is formed from the first source/drain region to the channel region.

5. The method of claim 1, wherein the first transistor is formed perpendicular to a plane of the substrate.

6. The method of claim 1, further comprising:
    forming at least two openings through the multilayer stack to the surface of the substrate; and
    growing a second transistor in a second opening of the at least two openings, wherein
    one of the first transistor and the second transistor is an NMOS transistor, and
    one of the first transistor and the second transistor is a PMOS transistor, the first transistor being grown proximal to the second transistor.

7. The method of claim 1, further comprising:
    removing the multilayer stack surrounding the first transistor to isolate the first transistor such that sidewall structures including trimmed portions of the first dielectric material, the second dielectric material, and the third dielectric material remain surrounding the first transistor.

8. The method of claim 7, further comprising:
    removing two predetermined layers of the first dielectric material, the second dielectric material, and the third dielectric material in the sidewall structures; and
    forming a first source/drain contact proximal to the first source/drain region, a gate contact proximal to the channel region, and a second source/drain contact proximal to the second source/drain region.

9. The method of claim 8, wherein forming the first source/drain contact and the second source/drain contact further comprises executing a salicidation along the uncovered first source/drain region and the uncovered second source/drain region using a metal silicide, and the first source/drain contact and the second source/drain contact are formed on the metal silicide.

10. A method of fabricating a semiconductor device, comprising:
    forming a multilayer stack on a surface of a substrate, the multilayer stack including a first dielectric material in a first layer, a second dielectric material in a second layer, and a third dielectric material in a third layer, any one of the first dielectric material, the second dielectric material, and the third dielectric material being selective to the other dielectric materials;
    forming at least one opening through the multilayer stack to the surface of the substrate;

growing a first transistor in a first opening of the at least one opening using a single epitaxial growth sequence, the first transistor including a first source/drain region proximal to the substrate, a channel region disposed vertically overtop the first source/drain region, and a second source/drain region disposed vertically overtop the channel region on a side of the channel region distal to the substrate, a vertical thickness of the second layer of the second dielectric material being equal to a vertical thickness of the channel region disposed, the second layer of the second dielectric material being disposed parallel with the channel region along a horizontal plane;

removing the multilayer stack surrounding the first transistor to isolate the first transistor such that sidewall structures including trimmed portions of the first dielectric material, the second dielectric material, and the third dielectric material remain surrounding the first transistor;

uncovering portions of the first source/drain region and the second source/drain region via removing portions of the sidewall structures adjacent to the first source/drain region and the second source/drain region;

executing a salicidation process to form a metal silicide on the uncovered portions of the first source/drain region and the second source/drain region;

uncovering portions of the channel region via removing portions of the sidewall structures adjacent to the channel region; and depositing a high-K dielectric on the uncovered portions of the channel region.

11. The method of claim 10, further comprising:
forming a gate contact on the high-K dielectric; and
forming a first source/drain contact on the metal silicide proximal to the first source/drain region and a second source/drain contact on the metal silicide proximal to the second source/drain region.

12. The method of claim 10, wherein the first source/drain region transitions into the channel region having a first predetermined gradient and the channel region transitions into the second source/drain region having a second predetermined gradient.

13. The method of claim 10, wherein epitaxially growing the first transistor further comprises:
executing a first epitaxy process with a first dopant that forms the first source/drain region proximal to the substrate, the first source/drain region being doped with the first dopant;
executing a second epitaxy process to form the channel region vertically overtop the first source/drain region, a thickness of the channel region controlled by the second epitaxy process; and
executing a third epitaxy process with the first dopant to form the second source/drain region vertically overtop the channel region, the second source/drain region being doped with the first dopant.

14. The method of claim 10, wherein the multilayer stack includes alternating layers of the first dielectric material in the first layer, the second dielectric material in the second layer, and the third dielectric material in the third layer.

15. The method of claim 10, wherein the first transistor is formed perpendicular to a plane of the substrate.

16. The method of claim 10, further comprising:
forming at least two openings through the multilayer stack to the surface of the substrate; and
growing a second transistor in a second opening of the at least two openings, wherein
one of the first transistor and the second transistor is an NMOS transistor, and
one of the first transistor and the second transistor is a PMOS transistor, the first transistor being grown proximal to the second transistor.

17. The method of claim 16, further comprising:
removing the multilayer stack surrounding the second transistor to isolate the second transistor such that sidewall structures including trimmed portions of the first dielectric material, the second dielectric material, and the third dielectric material remain surrounding the second transistor.

18. A semiconductor device, comprising:
a first source/drain region disposed on a substrate;
a channel region disposed vertically overtop the first source/drain region perpendicular relative to a plane of the substrate;
a second source/drain region disposed vertically overtop the channel region;
a metal silicide formed laterally along sidewalls of the first source/drain region and laterally along sidewalls of the second source/drain region;
a high-K dielectric formed laterally adjacent to sidewalls of the channel region;
a first source/drain contact formed laterally along the metal silicide formed on the first source/drain region;
a second source/drain contact formed laterally along the metal silicide formed on the second source/drain region; and
a gate contact formed on the high-K dielectric.

19. The device of claim 18, wherein
a vertical thickness of the gate contact is equal to a vertical thickness of the channel region, and
the first source/drain region, the second source/drain region, and the channel region are formed via an epitaxial growth process, the vertical thickness of the channel region being determined by the epitaxial growth process.

* * * * *